US012761569B2

(12) United States Patent
Elazhary et al.

(10) Patent No.: US 12,761,569 B2
(45) Date of Patent: Oct. 13, 2026

(54) METROLOGY SYSTEM AND METHOD

(71) Applicants: ASML HOLDING N.V., Veldhoven (NL); ASML NETHERLANDS B.V., Veldhoven (NL)

(72) Inventors: Tamer Mohamed Tawfik Ahmed Mohamed Elazhary, New Canaan, CT (US); Simon Reinald Huisman, Eindhoven (NL); Justin Lloyd Kreuzer, Trumbull, CT (US); Sebastianus Adrianus Goorden, Eindhoven (NL)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 60 days.

(21) Appl. No.: 17/637,156

(22) PCT Filed: Aug. 25, 2020

(86) PCT No.: PCT/EP2020/073777
§ 371 (c)(1),
(2) Date: Feb. 22, 2022

(87) PCT Pub. No.: WO2021/037867
PCT Pub. Date: Mar. 4, 2021

(65) Prior Publication Data
US 2022/0283515 A1 Sep. 8, 2022

Related U.S. Application Data

(60) Provisional application No. 62/894,116, filed on Aug. 30, 2019.

(51) Int. Cl.
*G03F 7/20* (2006.01)
*G03F 7/00* (2006.01)

(52) U.S. Cl.
CPC ................................ *G03F 7/70633* (2013.01)

(58) Field of Classification Search
CPC .................................................. G03F 7/70633
See application file for complete search history.

(56) References Cited

U.S. PATENT DOCUMENTS 5,229,872 A 7/1993 Mumola
9,739,702 B2 * 8/2017 Bringoltz ............. G01B 11/272
(Continued)

FOREIGN PATENT DOCUMENTS

WO 2004023214 3/2004
WO 2009078708 6/2009
(Continued)

OTHER PUBLICATIONS

International Search Report and Written Opinion issued in corresponding PCT Patent Application No. PCT/EP2020/073777, dated Dec. 9, 2020.
(Continued)

*Primary Examiner* — Mesfin T Asfaw
(74) *Attorney, Agent, or Firm* — Pillsbury Winthrop Shaw Pittman, LLP

(57) ABSTRACT

A method of determining an overlay measurement associated with a substrate and a system to obtain an overlay measurement associated with a patterning process. A method for determining an overlay measurement may be used in a lithography patterning process. The method includes generating a diffraction signal by illuminating a first overlay pattern and a second overlay pattern using a coherent beam. The method also includes obtaining an interference pattern based on the diffraction signal. The method further includes determining an overlay measurement between the first overlay pattern and the second overlay pattern based on the interference pattern.

20 Claims, 23 Drawing Sheets

(56) References Cited

U.S. PATENT DOCUMENTS

| | | | | |
|---|---|---|---|---|
| 2002/0081758 | A1 | 6/2002 | Iriki | |
| 2003/0021466 | A1 | 1/2003 | Adel et al. | |
| 2006/0033921 | A1 | 2/2006 | Den Boef et al. | |
| 2006/0066855 | A1 | 3/2006 | Boef et al. | |
| 2007/0077503 | A1 | 4/2007 | Yoo | |
| 2009/0262362 | A1 | 10/2009 | De Groot et al. | |
| 2009/0316979 | A1 * | 12/2009 | Gidon | G03F 7/70625 356/601 |
| 2010/0201963 | A1 | 8/2010 | Cramer et al. | |
| 2011/0027704 | A1 | 2/2011 | Cramer et al. | |
| 2011/0043791 | A1 | 2/2011 | Smilde et al. | |
| 2012/0242970 | A1 | 9/2012 | Smilde et al. | |
| 2014/0233031 | A1 * | 8/2014 | Van Der Schaar | H01L 23/58 356/399 |
| 2016/0061590 | A1 * | 3/2016 | Pandey | G03F 7/70633 356/614 |
| 2017/0053842 | A1 | 2/2017 | Roessiger et al. | |
| 2018/0024054 | A1 | 1/2018 | Moon et al. | |
| 2018/0246420 | A1 | 8/2018 | Pandey et al. | |
| 2018/0342063 | A1 * | 11/2018 | Lubashevsky | G01N 21/47 |
| 2019/0004439 | A1 | 1/2019 | Lubashevsky et al. | |
| 2019/0086201 | A1 | 3/2019 | Den Boef et al. | |

FOREIGN PATENT DOCUMENTS

| | | |
|---|---|---|
| WO | 2009106279 | 9/2009 |
| WO | 2014062972 | 4/2014 |

OTHER PUBLICATIONS

Office Action issued in corresponding Chinese Patent Application No. 202080060240.4, dated Jan. 26, 2024.

Office Action issued in corresponding Chinese Patent Application No. 202080060240.4, dated Jul. 2, 2024.

Office Action issued in corresponding Korean Patent Application No. 10-2022-7006615, dated Jul. 15, 2024.

* cited by examiner

METROLOGY SYSTEM AND METHOD

CROSS-REFERENCE TO RELATED APPLICATIONS

This application is the U.S. national phase entry of PCT Patent Application No. PCT/EP2020/073777 which was filed on Aug. 25, 2020, which claims the benefit of priority of U.S. Provisional Patent Application No. 62/894,116, which was filed on Aug. 30, 2019, and which is incorporated herein in its entirety by reference.

FIELD

The description herein relates generally to improved metrology systems and methods for overlay measurement in a lithography process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of a die, one die, or several dies) on a substrate (e.g., a silicon wafer). Transfer of the pattern is typically via imaging onto a layer of radiation-sensitive material (resist) provided on the substrate. In general, a single substrate contains a plurality of adjacent target portions to which the pattern is transferred successively by the lithographic apparatus, one target portion at a time. In one type of lithographic apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. It is also possible to transfer the pattern from the patterning device to the substrate by imprinting the pattern onto the substrate.

SUMMARY

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more of these errors and take steps to design, modify, control, etc. a patterning process to reduce or minimize one or more of these errors.

The present disclosure addresses various problems discussed above. In a first aspect, the present disclosure provides an improved method of determining an overlay measurement between a first overlay pattern on a top layer and a second overlay pattern on a bottom layer in the lithography process. The overlay measurement may be in micrometer scale, in nanometer scale, or in sub-nanometer scale.

The present disclosure sets forth a number of improvements in a design of an optical system for the overlay measurement in the lithography process (e.g., an addition of a pupil camera in the optical system, a coherent light source being used in the optical system, etc.). The present disclosure also sets forth a design of similar alignment marks on a top layer and on a bottom layer on a substrate to improve the overlay measurement in a lithography process.

In one embodiment, the present disclosure sets forth a method of determining an overlay measurement associated with a substrate, the method includes generating a diffraction signal by illuminating a first overlay pattern and a second overlay pattern using a coherent beam, the first overlay pattern disposed on a first layer of a substrate, and the second overlay pattern disposed on a second layer of the substrate; obtaining, based on the diffraction signal, an interference pattern; and determining, based on the interference pattern, an overlay measurement between the first overlay pattern and the second overlay pattern.

In one embodiment, the present disclosure sets forth a method of obtaining the interference pattern, the method includes obtaining a first diffraction signal diffracted from the first overlay pattern; obtaining a second diffraction signal diffracted from the second overlay pattern; superposing the first diffraction signal and the second diffraction signal at the pupil plane; and generating, based on the superimposed diffraction signals, the interference pattern at the pupil plane.

In one embodiment, the present disclosure sets forth a method of determining the overlay measurement between the first overlay pattern and the second overlay pattern, the method includes obtaining a first location associated with a first interference fringe of the interference pattern, the first interference fringe being associated with a positive non-zeroth order diffraction of the diffraction signal; obtaining a second location associated with a second interference fringe of the interference pattern, the second interference fringe being associated with a negative non-zeroth order diffraction of the diffraction signal; and determining, based on the first location and the second location associated with the interference pattern, an overlay error between the first overlay pattern and the second overlay pattern.

In one embodiment, the present disclosure further sets forth a method of determining an overlay measurement associated with a substrate, the method includes determining, via a processor, whether the overlay measurement breaches an overly threshold value, the threshold value being associated with a yield of the patterning process; and responsive to the breaching of the threshold value, providing, via an interface, a warning to adjust the patterning process.

In one embodiment, the present disclosure further sets forth a method of determining, via the processor, whether the overlay measurement breaches the overlay threshold value; responsive to the breaching of the threshold value, adjusting one or more parameters of a patterning apparatus used in the patterning process such that the overlay measurement is minimized; performing a removal process of the second layer; and patterning, after the removal process of the second layer, a new layer on the first layer on the substrate by using the adjusted one or more parameters of the patterning apparatus.

In one embodiment, the present disclosure sets forth a system to obtain an overlay measurement associated with a patterning process, the system includes a coherent beam generator configured to generate a coherent beam for illuminating a first overlay pattern and a second overlay pattern, the first overlay pattern disposed on a first layer of a substrate, the second overlay pattern disposed on a second layer of the substrate, the illuminating of the first overlay pattern and the second overlay pattern generating a diffraction signal; a detector configured to detect the diffraction signal and generate an interference pattern from the diffraction signal; and at least one processor configured to determine an overlay measurement between the first overlay pattern and the second overlay pattern based on the interference pattern.

According to an embodiment, there is provided a computer program product comprising a non-transitory, computer-readable medium having instructions recorded thereon. The instructions, when executed by a computer, implement the methods listed in the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed embodiments. In the drawings.

DETAILED DESCRIPTION

Figure 1:
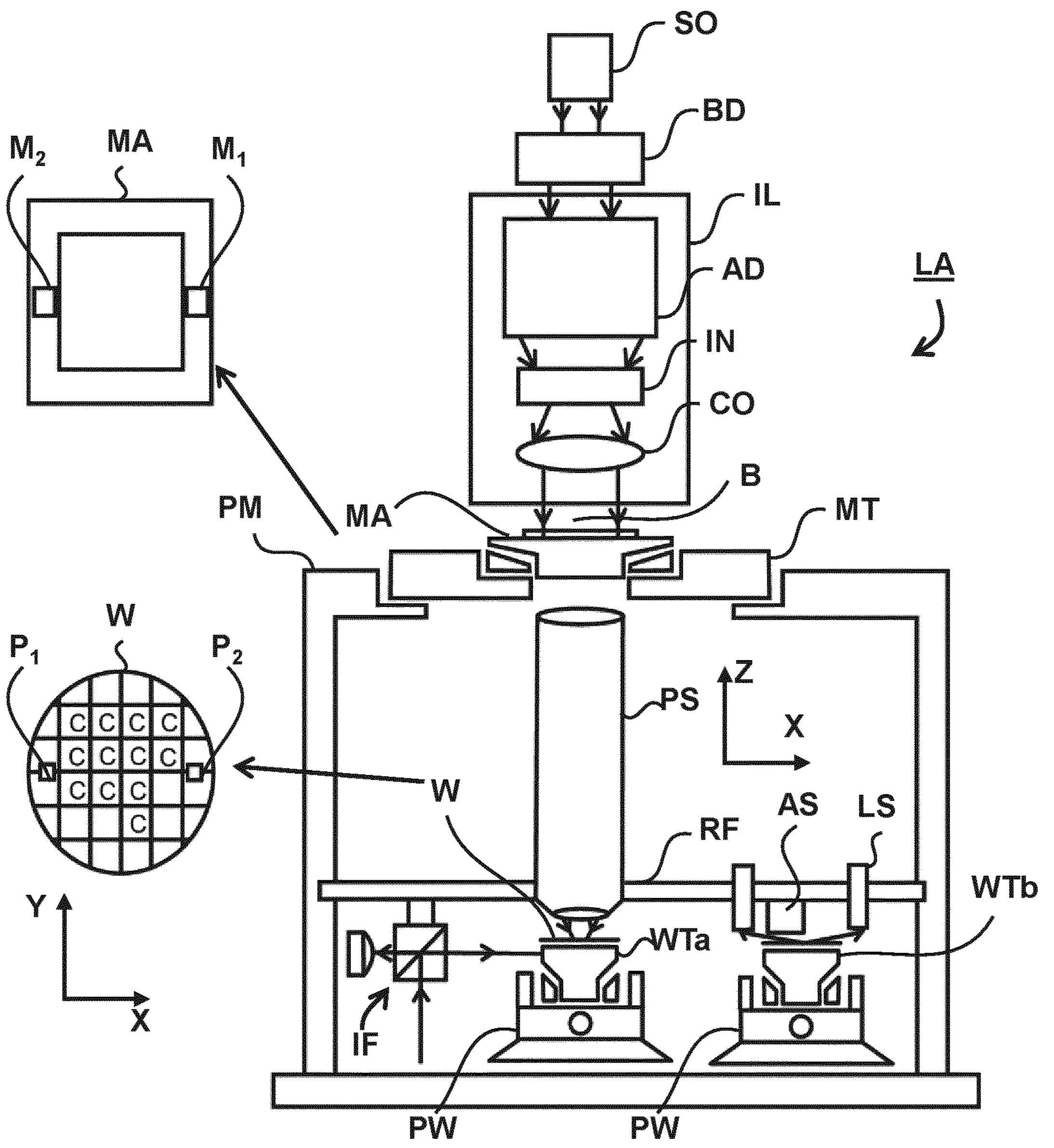
FIG. 1 illustrates a lithographic apparatus, according to an embodiment.

The present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the disclosure is intended to encompass other embodiments including a plurality of the same component, and vice-versa, unless explicitly stated otherwise herein.

Moreover, applicants do not intend for any term in the specification or claims to be ascribed an uncommon or special meaning unless explicitly set forth as such. Further, the present disclosure encompasses present and future known equivalents to the known components referred to herein by way of illustration.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" used herein encompass all types of electromagnetic radiation, including visible radiation (for example, having a wavelength $\lambda$ in the range of 400 to 780 nm), ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm Vacuum UV, or VUV (e.g., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronic means.

An example of a programmable LCD array is given in U.S. Pat. No. 5,229,872, which is incorporated herein by reference.

FIG. 1 is schematically a lithographic apparatus. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as desired. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if used, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (e.g., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above-described modes of use or entirely different modes of use may also be employed.

Lithographic apparatus LA is of a so-called dual stage type which has two substrate tables WTa, WTb and two stations—an exposure station EXP and a measurement station MEA-between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2A:
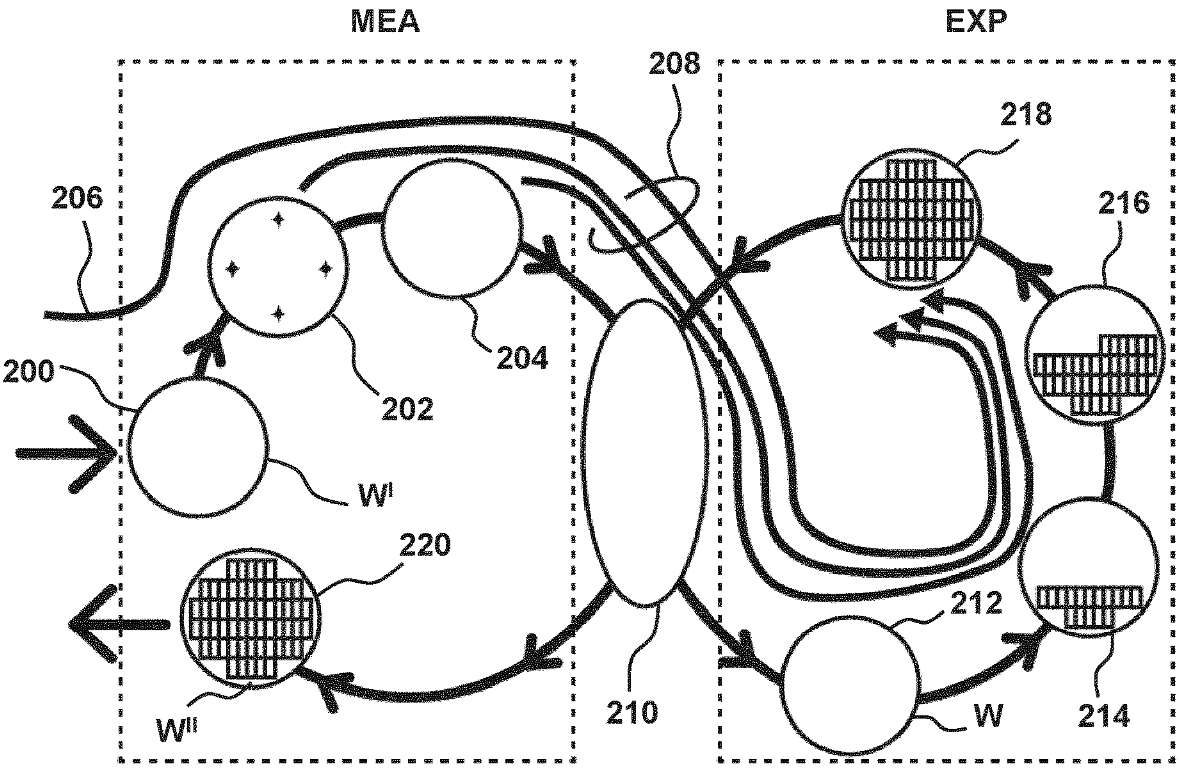
FIG. 2A illustrates schematically measurement and exposure processes in the apparatus of FIG. 1, according to an embodiment.

FIG. 2A illustrates schematically measurement and exposure processes in the apparatus of FIG. 1 which includes the steps to expose target portions (e.g. dies) on a substrate W in the dual stage apparatus of FIG. 1. On the left-handed side within a dotted box steps are performed at a measurement station MEA, while the right-handed side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the purpose of improving overlay performance, the task is to ensure that new patterns are applied in the correct position on a substrate that has already been subjected to one or more cycles of patterning and processing. These processing steps progressively introduce distortions in the substrate that can be measured and corrected for to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion-type lithography tool, while others are exposed in a "dry" tool. Some layers may be exposed in a tool working at DUV wavelengths, while others are exposed using EUV wavelength radiation.

At 202, alignment measurements using the substrate marks P1, etc., and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid," which maps very accurately the distribution of marks across the substrate, including any distortion relative to a nominal rectangular grid.

At step 204, a map of wafer height (Z) against the X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. These recipe data are added to the measurements of wafer position, wafer grid, and height map that were made at 202, 204, and then a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the "ideal" grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station, and the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example, rather than measuring alignment in a single pass, often there will be separate phases of coarse and fine measurement, using the same or different marks. The coarse and/or fine alignment measurement steps can be performed before or after the height measurement, or interleaved.

In one embodiment, optical position sensors, such as alignment sensor AS, use visible and/or near-infra-red (NIR) radiation to read alignment marks. In some processes, processing of layers on the substrate after the alignment mark has been formed leads to situations in which the marks cannot be found by such an alignment sensor due to low or no signal strength.

Figure 2B:
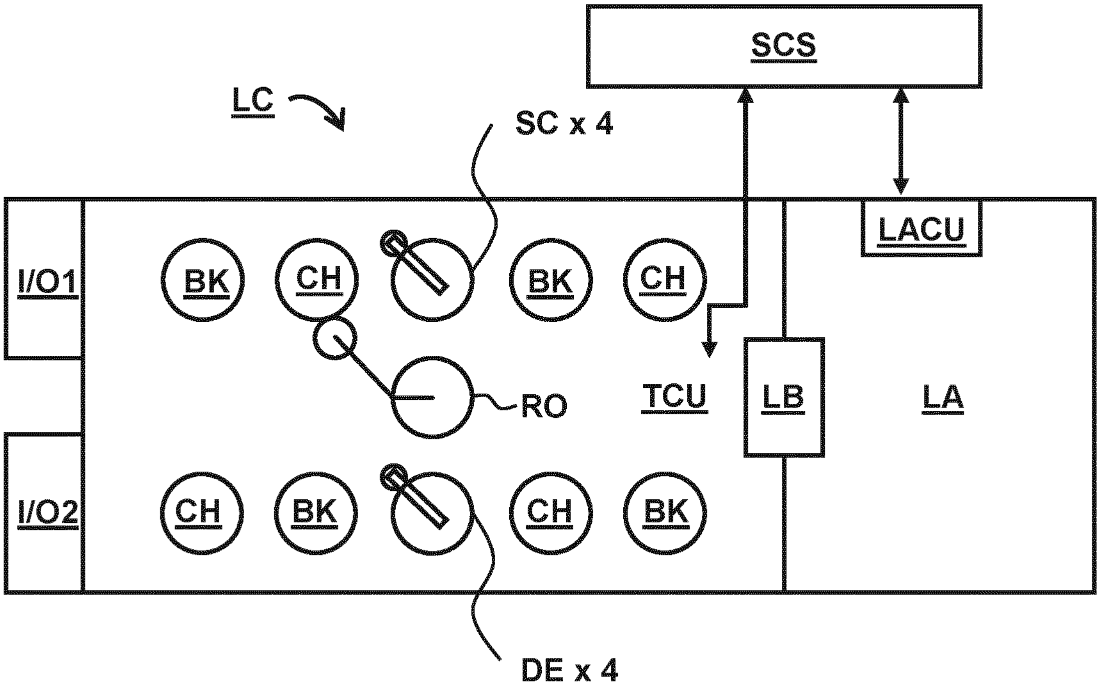
FIG. 2B illustrates a lithographic cell or cluster, according to an embodiment.

FIG. 2B illustrates a lithographic cell or cluster, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure or determine one or more properties such as overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. The metrology apparatus may be integrated into the lithographic apparatus LA or the lithocell LC or may be a stand-alone device. To enable rapid measurement, it is desirable that the metrology apparatus measure one or more properties in the exposed resist layer immediately after the exposure. However, the latent image in the resist has a low contrast—there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3A:
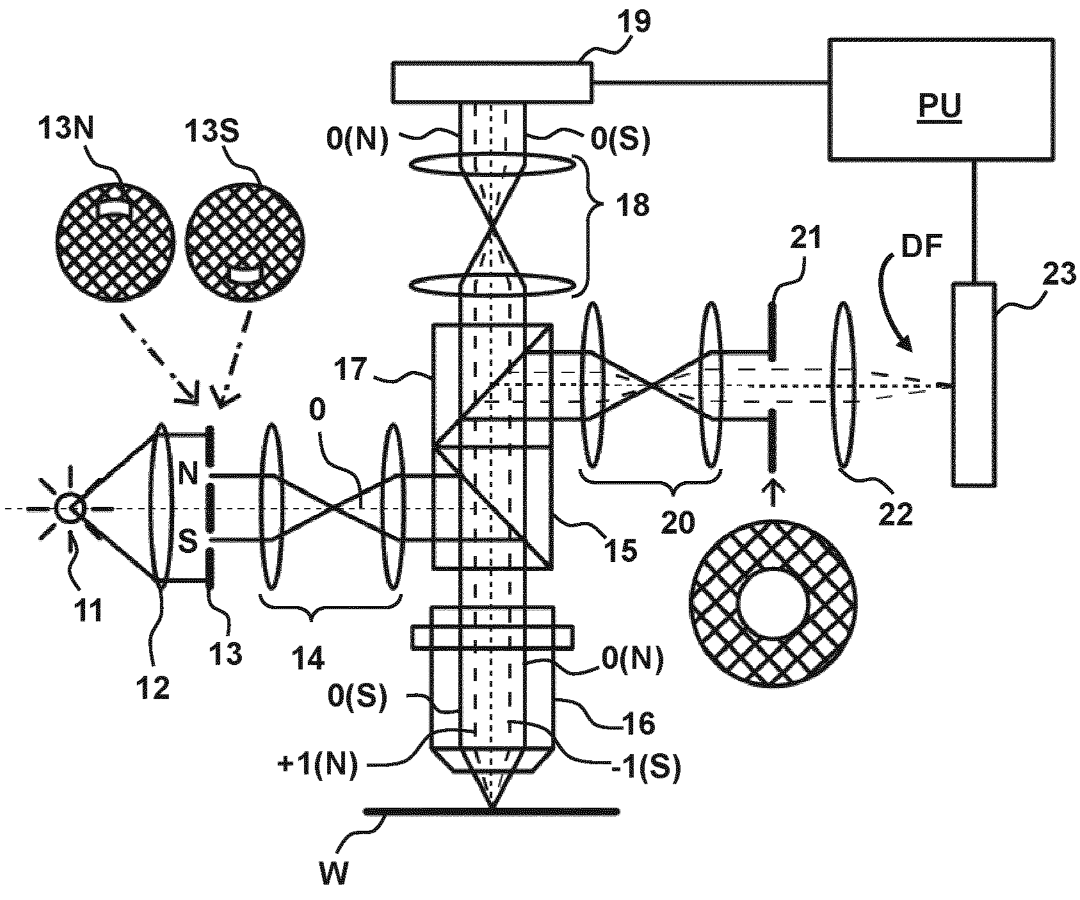
FIG. 3A is schematic diagram of a measurement apparatus for use in measuring targets according to an embodiment using a first pair of illumination apertures providing certain illumination modes.

FIG. 3A is schematic diagram of a measurement apparatus for use in measuring targets according to an embodiment using a first pair of illumination apertures providing certain illumination modes. A metrology apparatus suitable for use in embodiments to measure, e.g., overlay is also schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figure 3B:
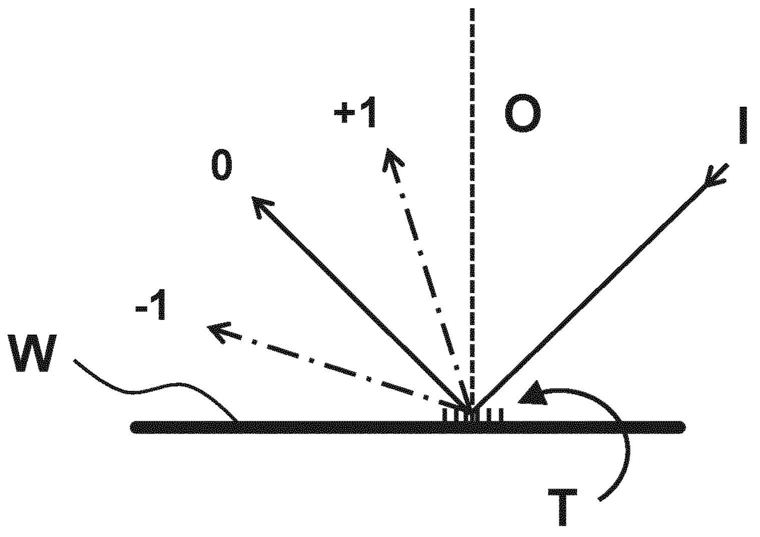
FIG. 3B is a schematic detail of a diffraction spectrum of a target for a given direction of illumination.

FIG. 3B is a schematic detail of a diffraction spectrum of a target for a given direction of illumination. As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the target is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented.

Figure 3C:
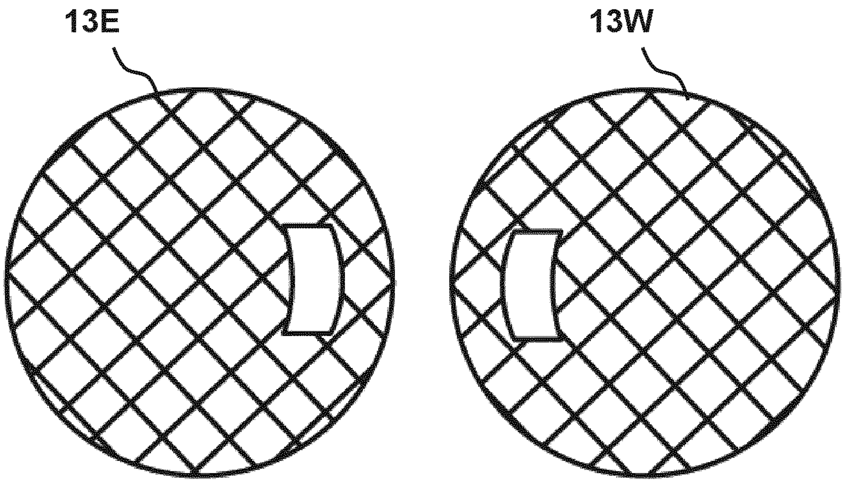
FIG. 3C is a schematic illustration of a second pair of illumination apertures providing further illumination modes in using a measurement apparatus for diffraction based overlay measurements.

FIG. 3C is a schematic illustration of a second pair of illumination apertures providing further illumination modes in using a measurement apparatus for diffraction based overlay measurements.

Figure 3D:
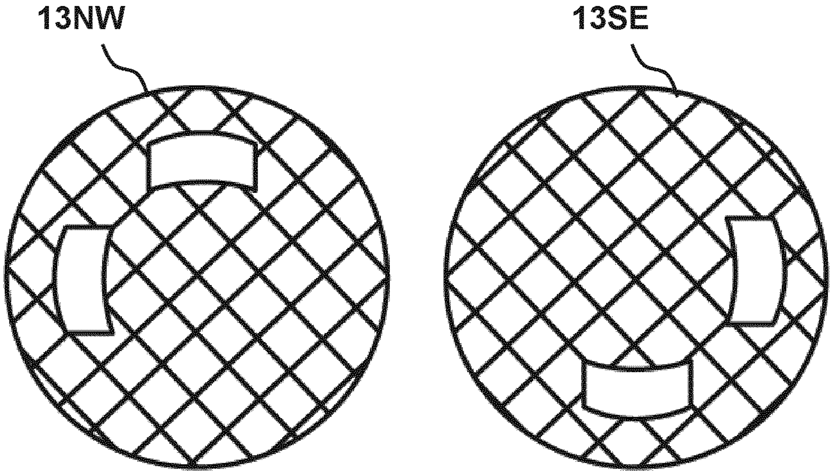
FIG. 3D is a schematic illustration of a third pair of illumination apertures combining the first and second pairs of apertures providing further illumination modes in using a measurement apparatus for diffraction based overlay measurements.

FIG. 3D is a schematic illustration of a third pair of illumination apertures combining the first and second pairs of apertures providing further illumination modes in using a measurement apparatus for diffraction based overlay measurements.

Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
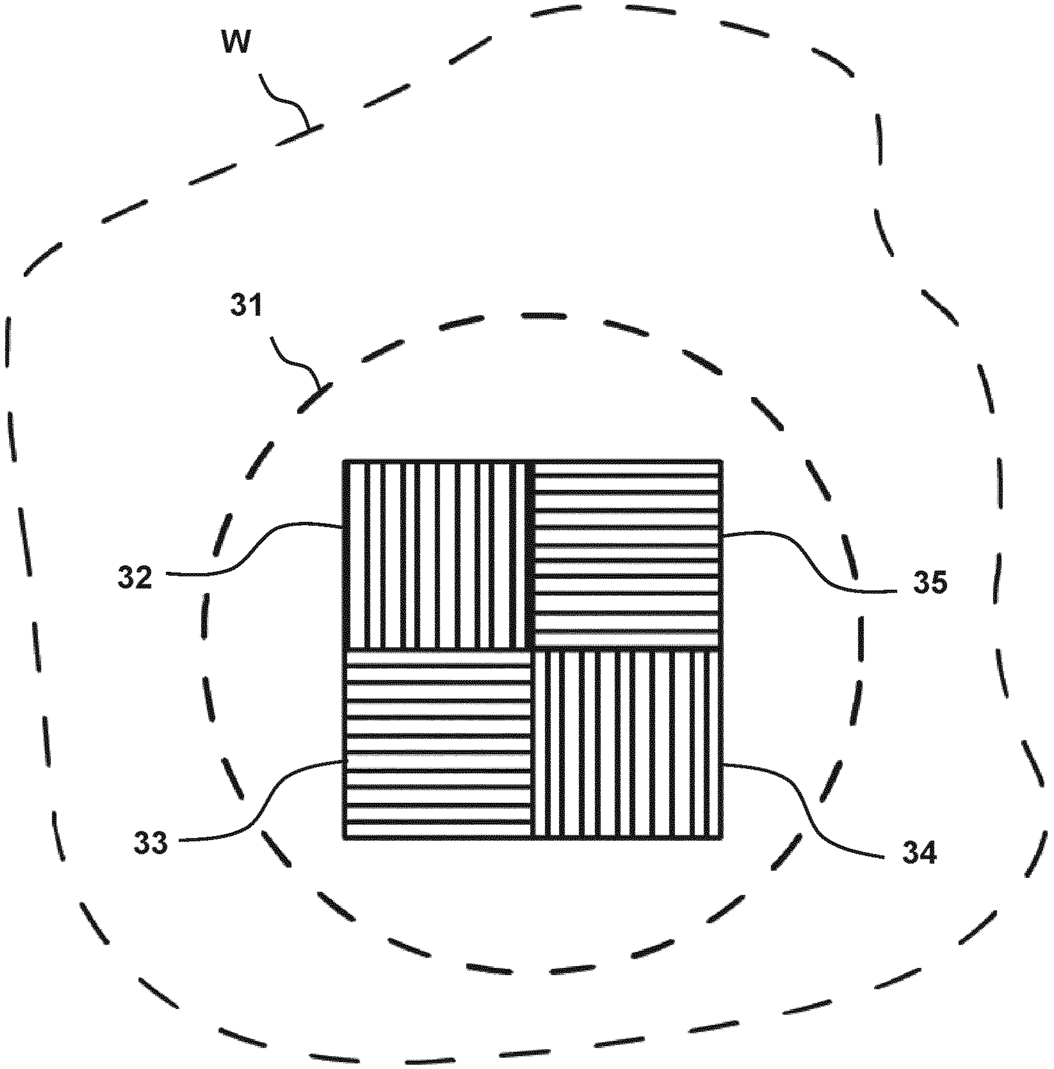
FIG. 4 schematically depicts a form of multiple periodic structure target and an outline of a measurement spot on a substrate.

FIG. 4 schematically depicts a form of multiple periodic structure (e.g., multiple grating) target and an outline of a measurement spot on a substrate.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (e.g., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, e.g., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

Figure 5:
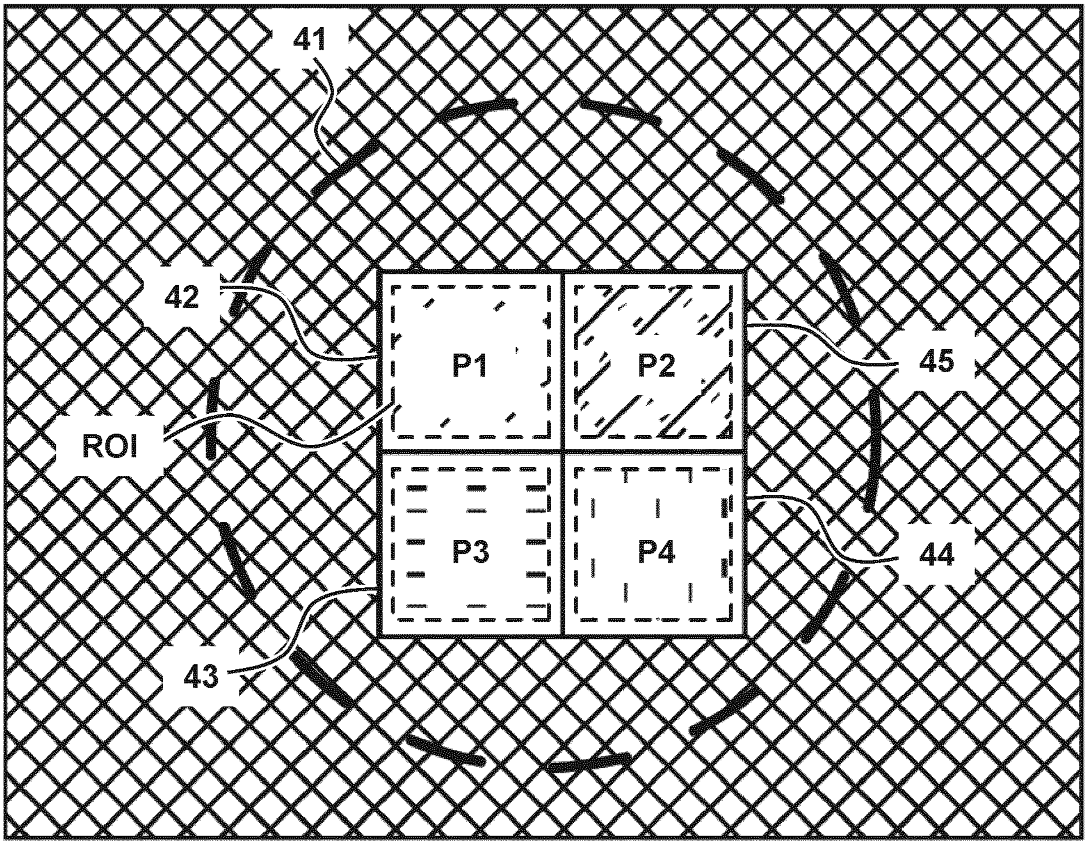
FIG. 5 schematically depicts an image of the target of FIG. 4 obtained in the apparatus of FIG. 3.

FIG. 5 schematically depicts an image of the target of FIG. 4 obtained in the apparatus of FIG. 3. FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
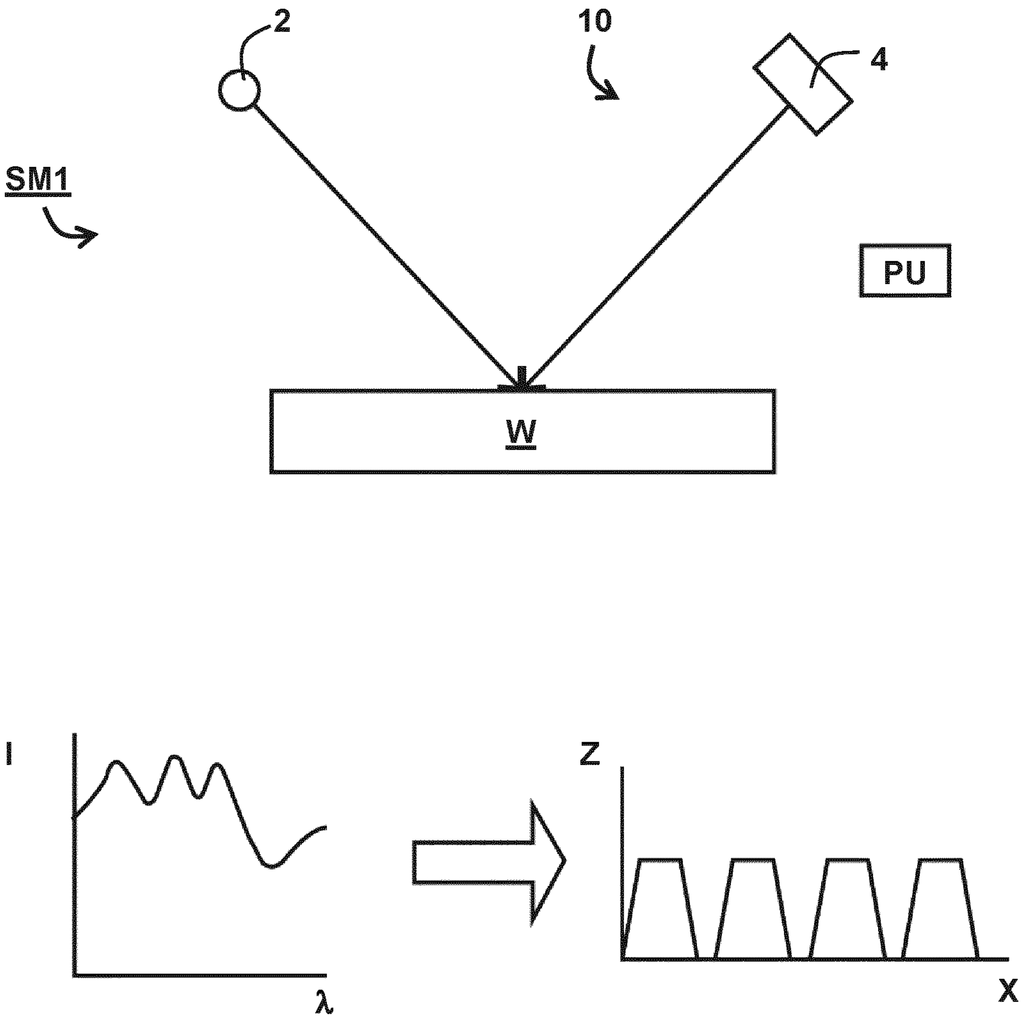
FIG. 6 schematically depicts an example metrology apparatus and metrology technique.

FIG. 6 schematically depicts an example metrology apparatus and metrology technique. In an embodiment, one of the parameters of interest of a patterning process is feature width (e.g., CD). FIG. 6 depicts a highly schematic example metrology apparatus (e.g., a scatterometer) that can enable feature width determination. It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 6. In general, for the reconstruction the general form of the structure is known and some variables are assumed from knowledge of the process by which the structure was made, leaving only a few variables of the structure to be determined from the measured data. Such a metrology apparatus may be configured as a normal-incidence metrology apparatus or an oblique-incidence metrology apparatus. Moreover, in addition to measurement of a parameter by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement in this manner are described, for example, in U.S. patent application publication US2006-066855, which is incorporated herein in its entirety.

Figure 7:
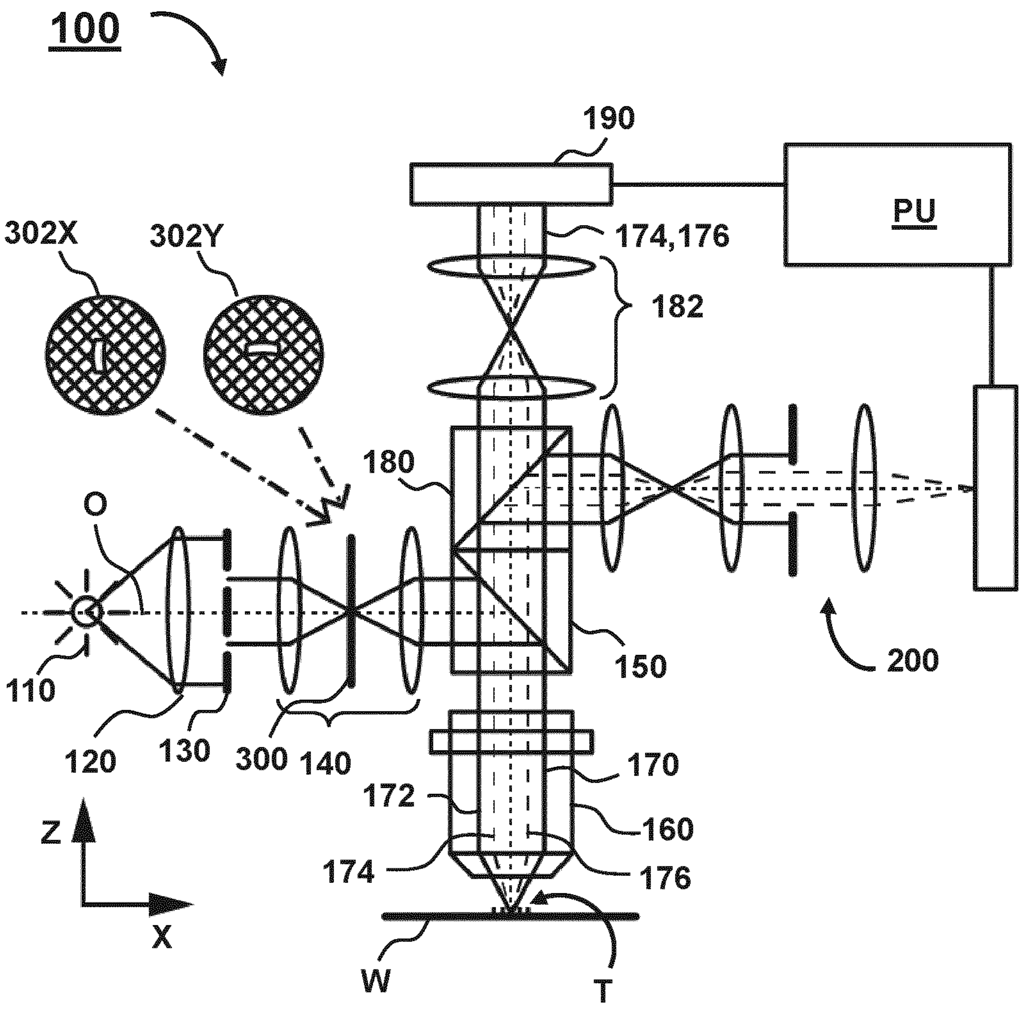
FIG. 7 schematically depicts an example metrology apparatus.

FIG. 7 illustrates an example of a metrology apparatus 100 suitable for use in embodiments of the present disclosure. The principles of operation of this type of metrology apparatus are explained in more detail in the U.S. Patent Application Publication Nos. US 2006-033921 and US 2010-201963, which are incorporated herein in their entireties by reference. An optical axis, which has several branches throughout the apparatus, is represented by a dotted line 0. In this apparatus, radiation emitted by source 110 (e.g., a xenon lamp) is directed onto substrate W via by an optical system comprising: lens system 120, aperture plate 130, lens system 140, a partially reflecting surface 150 and objective lens 160. In an embodiment these lens systems 120, 140, 160 are arranged in a double sequence of a 4F arrangement. In an embodiment, the radiation emitted by radiation source 110 is collimated using lens system 120. A different lens arrangement can be used, if desired. The angular range at which the radiation is incident on the substrate can be selected by defining a spatial intensity distribution in a plane that presents the spatial spectrum of the substrate plane. In particular, this can be done by inserting an aperture plate 130 of suitable form between lenses 120 and 140, in a plane which is a back-projected image of the objective lens pupil plane. Different intensity distributions (e.g., annular, dipole, etc.) are possible by using different apertures. The angular distribution of illumination in radial and peripheral directions, as well as properties such as wavelength, polarization and/or coherency of the radiation, can all be adjusted to obtain desired results. For example, one or more interference filters 130 can be provided between source 110 and partially reflecting surface 150 to select a wavelength of interest in the range of, say, 400-900 nm or even lower, such as 200-300 nm. The interference filter may be tunable rather than comprising a set of different filters. A grating could be used instead of an interference filter. In an embodiment, one or more polarizers 170 can be provided between source 110 and partially reflecting surface 150 to select a polarization of interest. The polarizer may be tunable rather than comprising a set of different polarizers.

As shown in FIG. 7, the target T is placed with substrate W normal to the optical axis O of objective lens 160. Thus, radiation from source 110 is reflected by partially reflecting surface 150 and focused into an illumination spot S on target Ton substrate W via objective lens 160. In an embodiment, objective lens 160 has a high numerical aperture (NA), desirably at least 0.9 or at least 0.95. An immersion metrology apparatus (using a relatively high refractive index fluid such as water) may even have a numerical aperture over 1.

Rays of illumination 170, 172 focused to the illumination spot from angles off the axis O gives rise to diffracted rays 174, 176. It should be remembered that these rays are just one of many parallel rays covering an area of the substrate including target T. Each element within the illumination spot is within the field of view of the metrology apparatus. Since the aperture in plate 130 has a finite width (necessary to admit a useful quantity of radiation), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the $0^{th}$ order diffracted by the target on substrate W is collected by objective lens 160 and directed back through partially reflecting surface 150. An optical element 180 provides at least part of the diffracted beams to optical system 182 which forms a diffraction spectrum (pupil plane image) of the target Ton sensor 190 (e.g. a CCD or CMOS sensor) using the zeroth and/or first order diffractive beams. In an embodiment, an aperture 186 is provided to filter out certain diffraction orders so that a particular diffraction order is provided to the sensor 190. In an embodiment, the aperture 186 allows substantially or primarily only zeroth order radiation to reach the sensor 190. In an embodiment, the sensor 190 may be a two-dimensional detector so that a two-dimensional angular scatter spectrum of a substrate target T can be measured. The sensor 190 may be, for example, an array of CCD or CMOS sensors, and may use an integration time of, for example, 40 milliseconds per frame. The sensor 190 may be used to measure the intensity of redirected radiation at a single wavelength (or narrow wavelength range), the intensity separately at multiple wavelengths or integrated over a wavelength range. Furthermore, the sensor may be used to separately measure the intensity of radiation with transverse magnetic- and/or transverse electric-polarization and/or the phase difference between transverse magnetic- and transverse electric-polarized radiation.

Optionally, optical element 180 provides at least part of the diffracted beams to measurement branch 200 to form an image of the target on the substrate Won a sensor 230 (e.g. a CCD or CMOS sensor). The measurement branch 200 can be used for various auxiliary functions such as focusing the metrology apparatus (e.g., enabling the substrate W to be in focus with the objective 160), and/or for dark field imaging of the type mentioned in the introduction.

In order to provide a customized field of view for different sizes and shapes of grating, an adjustable field stop 300 is provided within the lens system 140 on the path from source 110 to the objective lens 160. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to different types of measurement, the aperture plate 300 may comprise a number of aperture patterns formed around a disc, which rotates to bring a desired pattern into place. Alternatively or in addition, a set of plates 300 could be provided and swapped, to achieve the same effect. Additionally or alternatively, a programmable aperture device such as a deformable mirror array or transmissive spatial light modulator can be used also.

Typically, a target will be aligned with its periodic structure features running either parallel to the Y axis or parallel to the X axis. With regard to its diffractive behavior, a periodic structure with features extending in a direction parallel to the Y axis has periodicity in the X direction, while the periodic structure with features extending in a direction parallel to the X axis has periodicity in the Y direction. In order to measure the performance in both directions, both types of features are generally provided. While for simplicity there will be reference to lines and spaces, the periodic structure need not be formed of lines and space. Moreover, each line and/or space between lines may be a structure formed of smaller sub-structures. Further, the periodic structure may be formed with periodicity in two dimensions at once, for example where the periodic structure comprises posts and/or via holes.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Devices are built up layer by layer and overlay is a measure of a lithographic apparatus' ability to print these layers accurately on top of each other. Successive layers or multiple processes on the same layer must be accurately aligned to the previous layer, otherwise electrical contact between structures will be poor and the resulting devices will not perform to specification. Overlay is a measure of the accuracy of this alignment. Good overlay improves device yield and enables smaller product patterns to be printed. The overlay error between successive layers formed in or on the patterned substrate is controlled by various parts of the exposure apparatus (of the lithographic apparatus). It is mostly the alignment system of the lithographic apparatus that is responsible for the alignment of the radiation onto the correct portions of the substrate.

Overlay may be measured using an "image-based" (box-in-box) technique or Diffraction-Based Overlay (DBO) metrology. DBO is an emerging metrology technique used because its TMU (Total Measurement Uncertainty) is typically better compared to "image-based" techniques. In the "image-based" case, overlay may be derived from a measurement of the position of a resist marker pattern relative to a marker pattern in an earlier formed product layer. In the DBO case, overlay is indirectly measured, for example by detecting a shape of an interference pattern from diffracted beams of two similar grating structures such as a top layer (e.g., resist layer) grating stacked over a bottom layer (e.g., product layer) grating.

However, a problem is that the broadband radiation beam is not able to generate a diffraction interference pattern from the diffracted beams of two similar grating structures because the broadband radiation beam is not a coherent radiation beam. Therefore, the shape of the interference pattern from diffracted beams of the two similar grating structures cannot be distinguished at a pupil plane of the metrology system. An overlay error cannot be indirectly measured easily if the shape of the interference pattern from the diffracted beams of the two similar grating structures cannot be distinguished.

Figure 8:
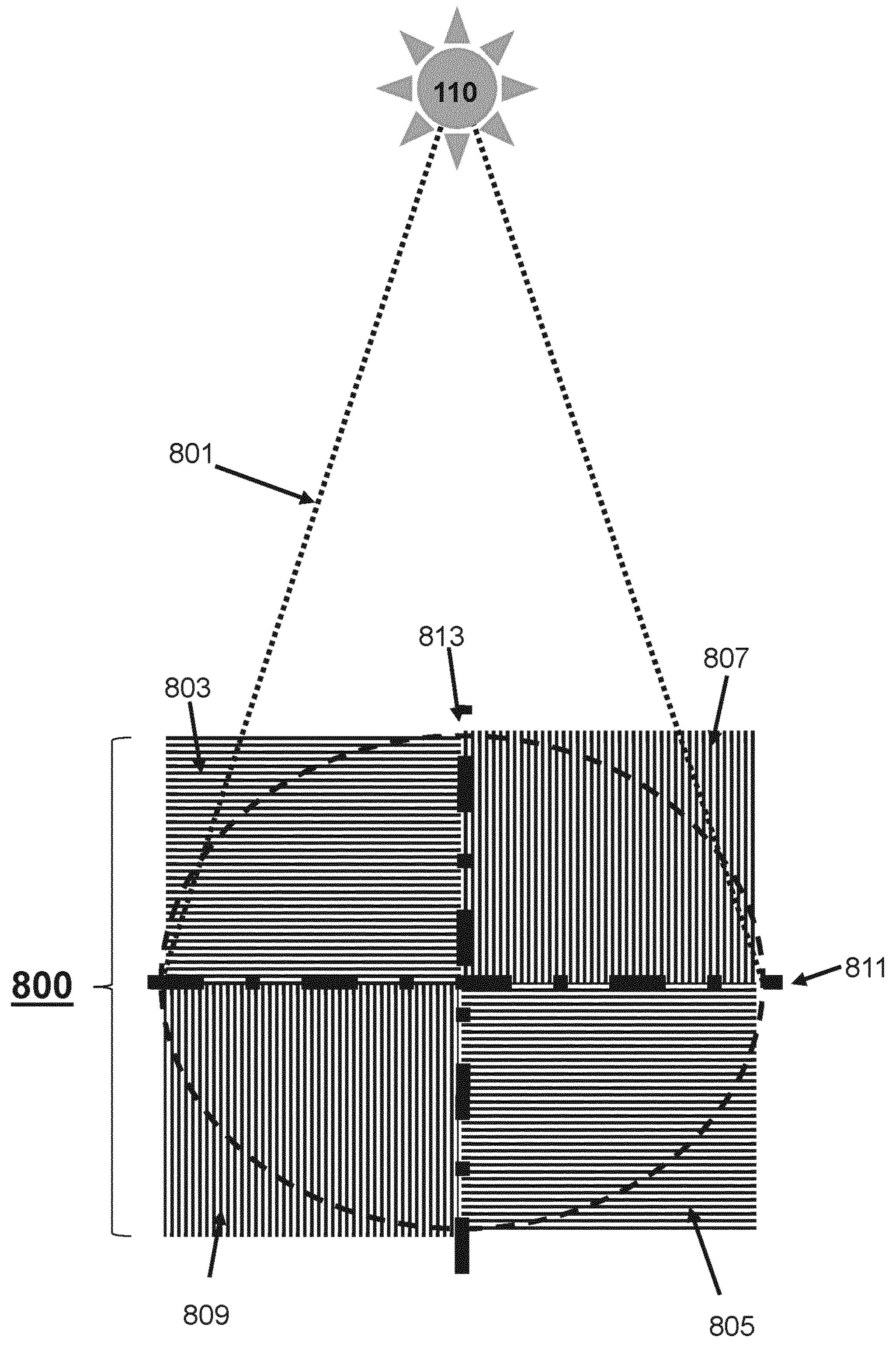
FIG. 8 illustrates schematically a system for illuminating an overlay pattern, according to an embodiment.

FIG. 8 illustrates schematically, a more specific description and embodiment of illuminating an overlay pattern 800 using a coherent radiation beam 801 (e.g., a Gaussian beam, etc.) from a coherent light source 110. In an embodiment, the overlay pattern (e.g., alignment mark) comprises a first overlay pattern in an upper left quadrant 803 a second overlay pattern in a lower right quadrant 805, a third overlay pattern in an upper right quadrant 807, and a fourth overlay pattern in a lower left quadrant 809. In an embodiment, the radiation beam 801 is incident generally perpendicular to overlay pattern 800 on the substrate (e.g., wafer W in the system of FIG. 7). In an embodiment, the substrate is made of one or more materials (e.g., silicon, silicon oxide, silicon on insulator (SOI), etc.). The radiation beam 801 (e.g., a coherent beam, a gaussian beam . . . etc.) may be from a tunable light source. In an embodiment, the tunable light source can adjust the wavelength of the radiation beam 801. The overlay pattern 800 may be patterned on substrate, in accordance with the present disclosure. In an embodiment, the radiation beam 801 illuminates the overlay pattern 800 spread across four quadrants 803, 805, 807, and 809. The beam in FIG. 8 is illustrated as a diverging beam that spreads. In an embodiment, the radiation 801 has a formed beam shape (e.g., a circle or an elliptical shape in FIG. 8, etc.). However, the present disclosure is not limited to a particular illumination shape.

In one embodiment, the first overlay pattern in an upper left quadrant 803 is disposed on a first layer of a substrate (e.g., a top layer, a resist layer, etc.). The second overlay pattern in a lower right quadrant 805 is disposed on a second layer of the substrate (e.g., a bottom layer, a product layer.). In an embodiment, the product layer may be a layer containing an etching layer, a diffusion layer, or a thin film deposition layer of a product (e.g., a semiconductor device, a biological device, or an optoelectronics device, etc.) In an embodiment, the first overlay pattern is imaged at a first location on the substrate (e.g., the upper left quadrant 803) and the second overlay pattern is imaged at a second location of the substrate (e.g., the lower right quadrant 805). The second location (e.g., the lower right quadrant 805) is diagonally opposite to the first location (e.g., the upper left quadrant 803). The present disclosure is not limited to a diagonal placement of the first and second overlay patterns. In some embodiments, different orientations or relative placements between the first and second overlay patterns is possible. For example, the first overlay pattern may be placed adjacent to the second overlay pattern such that the parallel lines of each pattern are approximately inline.

In an embodiment, the first overlay pattern in quadrant 803 and the second overlay pattern in quadrant 805 are shown as having the same or similar periodic structures comprising parallel lines. However, the overly pattern is not limited to a particular feature shape of pattern. In some embodiments, the first overlay pattern and the second overlay pattern can be dashed lines, rectangular lines, L-shape, rectangular shape, triangles or other geometrical shapes that may be used for overlay measurements.

In an embodiment, the third overlay pattern in an upper right quadrant 807 is disposed on the same layer of the substrate as the first overlay pattern in the upper left quadrant 803 (e.g., a first layer, a top layer, a resist layer, etc.). In an embodiment, the third overlay pattern in the upper right quadrant 807 is disposed on a third layer of a substrate (e.g., a resist layer, a product layer, etc.). The fourth overlay pattern in a lower left quadrant 809 is disposed on the same layer of a substrate as the second overlay pattern in the lower right quadrant 805 (e.g., a second layer, a bottom layer, a product layer, etc.). In an embodiment, the fourth overlay pattern in the lower left quadrant 809 is disposed on a fourth layer of the substrate (e.g., a resist layer, a product layer, etc.). It can be understood by a person skilled in the art that the present disclosure is not limited to a particular order of layers or the sequence of layers on which the overlay patterns may be formed. For example, the first overlay pattern in quadrant 803 may be disposed on a first layer of a substrate, the second overlay pattern may be disposed on a third or fourth layer in quadrant 805 of the substrate. In addition, in some embodiments, there may be more than three layers (e.g., 3, 5, 6, 7, etc.) deposited on a substrate, each having its own grating or overlay pattern. Overlay measurements can be conducted between any two layers.

In an embodiment, the quadrants with the same or similar patterns (e.g., 803 and 805, 807 and 809) will be on different layers. In an embodiment, the first overlay pattern in the upper left quadrant 803 and the second overlay pattern in the lower right overlay quadrant 805 are patterned using a first reference pattern (e.g., a horizontal grating pattern). The first reference pattern has the horizontal grating pattern running along X axis 811 in FIG. 8. In contrast, the third overlay pattern in the upper right quadrant 807 and the fourth overlay pattern in the lower left quadrant 809 are patterned using a second reference pattern (e.g., a vertical grating pattern.). The second reference pattern (vertical grating pattern) has the vertical grating pattern running along Y axis 813 in FIG. 8. The horizontal and vertical grating patterns are presented as examples and do not limit the scope of the present disclosure. A different grating pattern such as angular grating, array of holes, etc, may also be employed. In some embodiments, the first reference pattern and the second reference pattern may be, but not limited to, dashed lines, rectangular lines, L-shape, rectangular shapes, triangles or other geometrical shapes that may be used for overlay measurements. In some embodiments, the overlay patterns patterned by the reference patterns may not be identical.

Figure 9A:
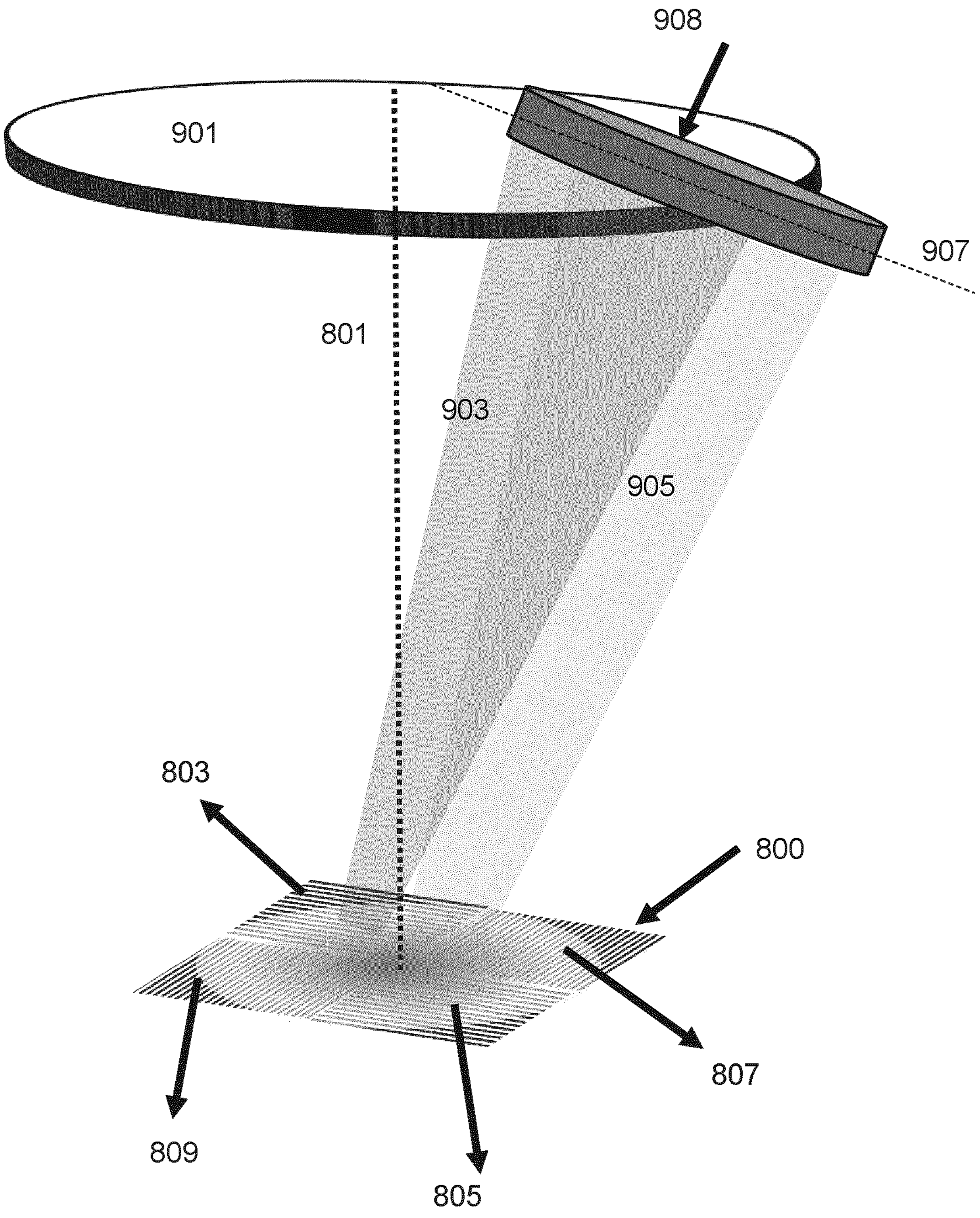
FIG. 9A illustrates schematically an overlay measurement of the alignment mark with gratings of similar features, according to an embodiment.

FIG. 9A illustrates schematically the capturing of a diffraction beam diffracted from an example overlay pattern used for overlay measurements, according to an embodiment.

For the overlay measurement, an optical component 901 (e.g., lens, lens elements, etc.) is used. The optical component 901 may be any one or a combination of various types of optical components, including refractive, reflective, magnetic, electromagnetic, and electrostatic optical components. In some examples, the optical component 901 is made from a radiation transmissive substance (e.g., glass, epoxy, quartz etc) for concentrating or dispersing light rays, used singly or with other optical components. In one embodiment, the optical component 901 may be used to concentrate and/or focus and incoming radiation 801 from a light source 110 (e.g., a laser, a coherent light source, etc.).

The incoming radiation 801 passes through the optical component 901 and impinges onto a layer (e.g., a thin film layer, a diffusion layer, an etching layer, a resist layer, etc.) within a stack of layers (e.g., a resist layer and a product layer, etc.) containing the overlay pattern 800. The incoming radiation 801 is reflected from the overlay pattern 800 (e.g., an overlay mark) generating a first diffraction beam 903 (e.g., +1st diffractive order beam) diffracted from the quadrant 803, and a second diffraction beam 905 (e.g., +1st diffractive order beam) diffracted from the quadrant 805. The first and the second diffraction beams 903 and 905 can include multiple diffraction orders, for example, higher or non-zeroth diffractive orders (e.g., the +1st and −1st diffractive orders). In some embodiments, the zeroth order may be blocked to avoid degrading a depth of modulation available in a detected signal. The first and the second diffraction beams 903 and 905 may be detected by a light sensitive element (e.g., a detector 908). Incoming radiation 801 diffracted from the horizontal gratings in the first overlay pattern in quadrant 803 becomes the first diffraction beam 903. Incoming radiation 801 diffracted from the horizontal gratings in the second overlay pattern in quadrant 805 becomes the second diffraction beam 905. The description herein is not limited to an overlay measurement using the first diffraction beam 903 diffracted from the first overlay pattern in quadrant 803 disposed on a first layer of a substrate, and the second diffraction beam 905 from the second overlay pattern disposed on a second layer in quadrant 805 of the substrate. For example, a third diffraction beam diffracted from the third overlay pattern disposed on a third layer of the substrate and/or a fourth diffraction beam diffracted from the fourth overlay pattern disposed on a fourth layer of the substrate may also be used for the overlay measurement.

The overlay measurement is not limited to any specific combination of diffractions beams diffracted from the first overlay pattern, the second overlay pattern, the third overlay pattern, or the fourth overlay pattern. In some embodiments, the overlay measurement may use more than two diffraction beams diffracted from any combination of the overlay patterns. The interaction of the first and the second diffraction beams 903 and 905 with the first overlay pattern and the second overlay pattern in the quadrants 803 and 805 is performed by superimposing the first diffraction signal and the second diffraction signal at a pupil plane 907 detected by a light sensitive element 908 (e.g., a detector such as a CCD or CMOS sensor). For example, the first diffraction signal is the first diffraction beam 903 detected by the light sensitive element or light detector 908 on the pupil plane 907. The second diffraction signal is the second diffraction beam 905 detected by the light detector 908 in the pupil plane 907. The pupil plane 907 is located at a specific distance (e.g., far field) with respect to the substrate. In an embodiment, this distance is larger than a single wavelength of an incident beam (e.g., the incoming beam 801. An interference pattern is generated based on superimposed diffraction signals from a first diffraction signal associated with the beam 903 and a second diffraction signal associated with the beam 905. In addition, the interference pattern is dependent on a wavelength of the radiation 801 (e.g., a coherent beam, a Gaussian beam, etc.).

Figure 9B:
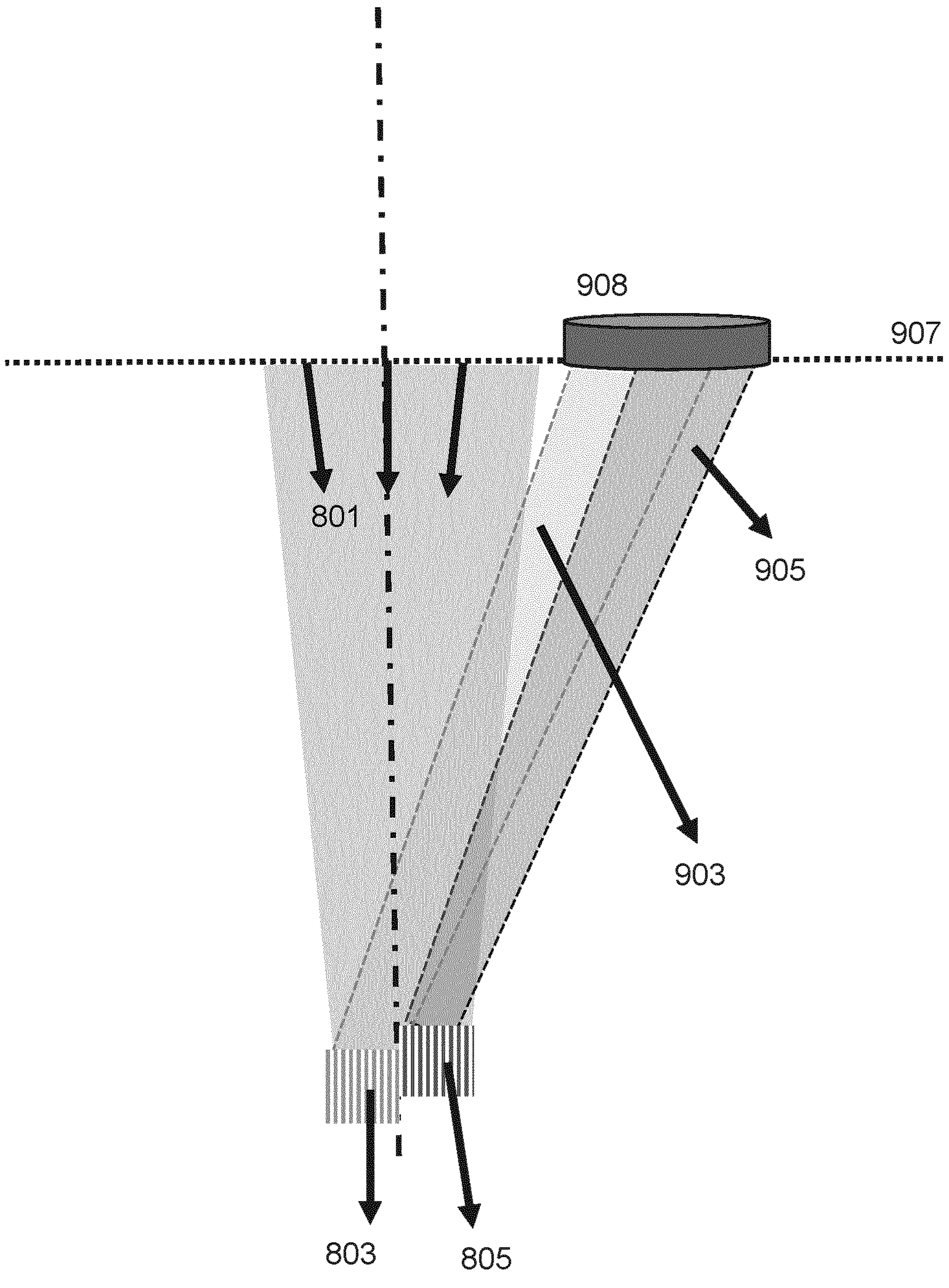
FIG. 9B illustrates schematically an overlay measurement of the alignment mark with gratings on different layers, according to an embodiment.

FIG. 9B illustrates schematically the diffraction from a portion (of FIG. 9A) of the overly patterns used for the overlay measurement, according to an embodiment.

The first overlay pattern in quadrant 803 and the overlay pattern in quadrant 805 has a distance (e.g., in x-direction or y-direction) between each other. In an embodiment, the y-distance is measured from a top surface of the top layer (or a higher layer) to a top surface of the bottom layer (or a relatively lower layer). In an embodiment, a change in the distance in x-direction between the overlay patterns from the quadrants 803 and 805 causes the superimposed diffraction signals detected by a light sensitive element 908 (e.g., a detector such as a CCD or CMOS sensor) from the first diffraction signal (e.g., diffracted signal from the quadrant 803) and the second diffraction signal (e.g., diffracted signal from the quadrant 805) to change. In an embodiment, the superimposed diffraction signal may also change due to change in a property (e.g., wavelength) of the incoming radiation 801. The light sensitive element 908 (e.g., a detector such as a CCD or CMOS sensor) resides at the pupil plane 907 to detect the superimposed diffraction signal.

In some embodiments, the interference pattern generated by the superimposed diffraction signal detected by the light detector 908 is dependent on the physical characteristics of the first overlay pattern in quadrant 803 and the second overlay pattern in quadrant 805. The physical characteristics may include a pitch of the first overlay pattern in quadrant 803 and the second overlay pattern in quadrant 805, a linewidth of the first overlay pattern in quadrant 803 and the second overlay pattern in quadrant 805, or a combination thereof.

Figure 9C:
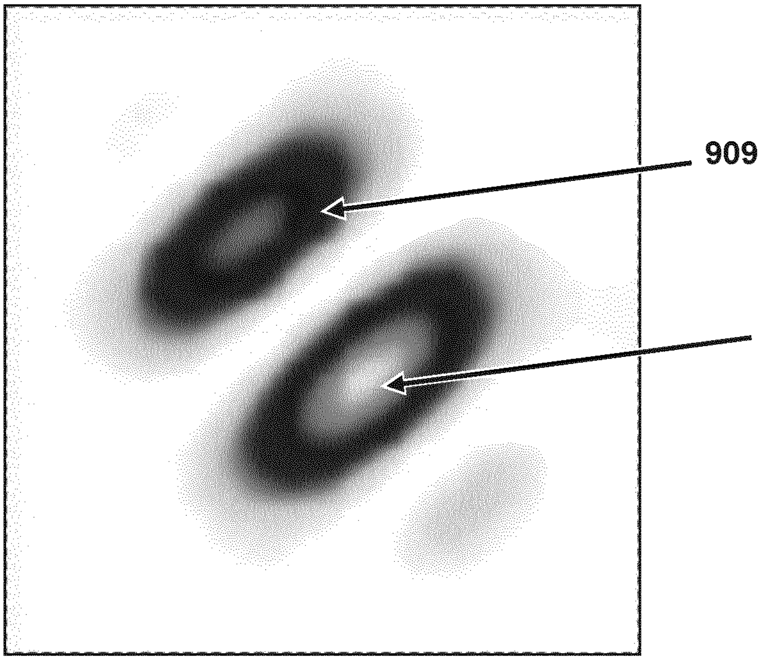
FIG. 9C illustrates a simulation result of generating an interference pattern on a pupil plane, according to an embodiment.

FIG. 9C illustrates a simulation result of generating an interference pattern on a pupil plane (e.g., the pupil plane 907 of FIG. 9B), according to an embodiment. The simulation may be performed by optical simulation tools (e.g., Finite-difference time-domain tools, etc.).

As mentioned earlier, the interference pattern (e.g., 909 and 911) is generated by superimposing the first diffraction beam 903 and the second diffraction beam 905 on the pupil plane 907. The shape of interference patterns 909 and 911 changes based on one or more physical characteristics of the overlay pattern 800 and/or properties on incoming radiation 801, as mentioned earlier. The grey scale values in the image of the interference patterns are indicative of intensity associated with the interference patterns.

In some embodiments, the interference pattern (e.g., 909 and 911 seen in FIGS. 9C and 9D) at the pupil plane 907 may include higher diffraction orders. The higher diffraction orders may be greater than 2nd order.

In some embodiments, the physical characteristics of the first overlay pattern and the second overlay pattern may include a pitch of the first overlay pattern in quadrant 803 and the second overlay pattern in quadrant 805, a linewidth of the first overlay pattern and the second overlay pattern, or a combination thereof. The physical characteristics of the first overlay pattern and the second overlay pattern, which affect interference patterns 909 and 911, may also include a distance of the first overlay pattern and the second overlay pattern (e.g., a distance between a top layer and a bottom layer, or between a resist layer and a product layer.). In some embodiments, the distance between the top layer and the bottom layer affects the interference patterns 909 and 911 detected by the light sensitive element 908 at the pupil plane 907 due to the specific distance (e.g., larger than a single wavelength of the incident beam 801) with respect to the substrate. The light sensitive element 908 (e.g., a detector such as a CCD or CMOS sensor) resides at the pupil plane 907 to detect the superimposed diffraction signal as previously mentioned with respect to FIG. 9C.

In some embodiments, interference fringes of the interference patterns 909 and 911 may be modulated by the tunable light source. As previously described in FIG. 8, the tunable light source can adjust the wavelength of the radiation beam 801. Thereby, a wavelength sweeping of the radiation beam 801 can be performed by the tunable light source, and the modulated interference fringes are further generated by the wavelength sweeping of the radiation beam 801. For example, the tunable light source may provide a wavelength spacing of 1 nm from 400 nm to 500 nm as the radiation beam 801 to perform the wavelength sweeping. In the embodiment, the modulated interference fringes are further used to determine the overlay measurement. For example, the interference fringe generated by a 400 nm radiation beam 801 will have a different location on the pupil plane from the location of the interference fringe generated by a 405 nm radiation beam 801. However, a displacement between the interference fringes from the 400 nm and 405 nm radiation beams 801 will not be affected by the measurement noise during the overlay measurement since a measurement noise is a constant for both the interference fringes generated by the 400 nm and 405 nm radiation beams 801 during the measurement. Therefore, the wavelength sweeping of the radiation beam 801 provides robust overlay measurements against the measurement noise.

Figure 9D:
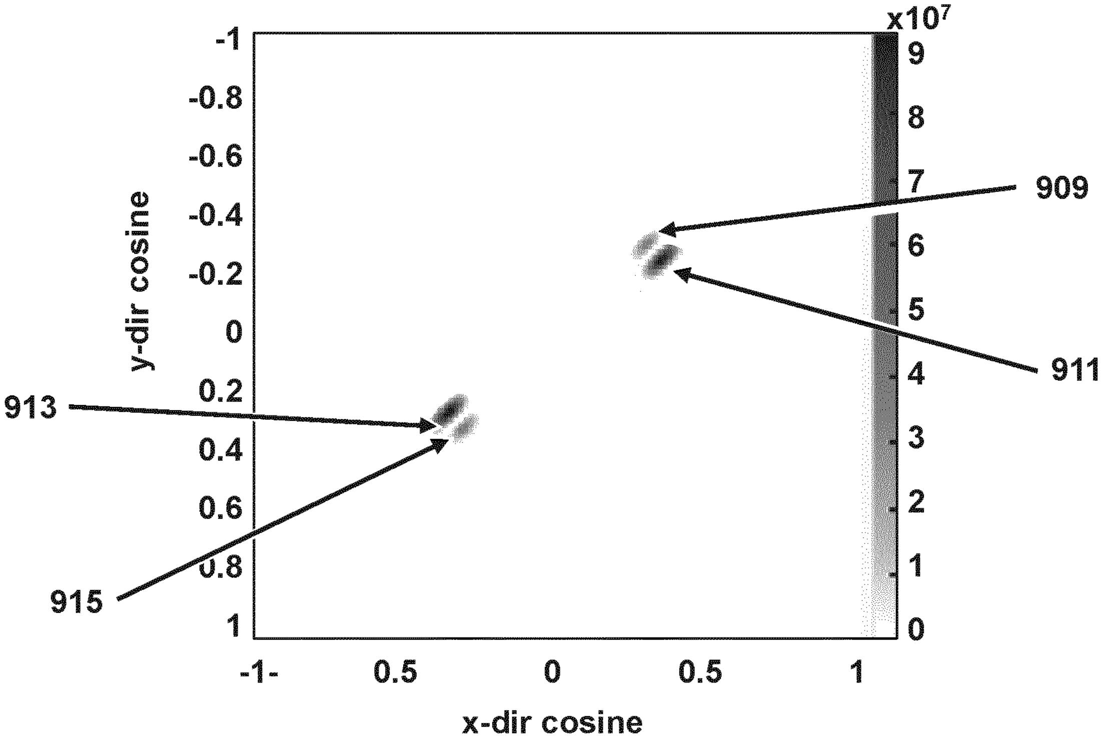
FIG. 9D illustrates a simulation result of locations of interference patterns from two different diffraction orders of diffraction signal on the pupil plane, for example, light diffracted from wafer at pupil plane (phase=$1.5\pi$), according to an embodiment.

FIG. 9D illustrates another simulation result of a different interference pattern generated from two different diffraction orders of diffraction signal on the pupil plane (e.g., the pupil plane 907 of FIG. 9B), according to an embodiment. The simulation may be performed by optical simulation tools (e.g., Finite-difference time-domain tools, etc.)

Specifically, the X axis and the Y axis represent locations in X axis and Y axis of the light diffracted from wafer at the pupil plane 907. Interference patterns 909 and 911 may be generated from the first diffraction beam 903 (e.g., +1st diffractive order beam) diffracted from the quadrant 803, and the second diffraction beam 905 (e.g., +1st diffractive order beam) diffracted from the quadrant 805.

In some embodiments, the interference patterns 913 and 915 may be generated from a third diffraction beam (e.g., −1st diffractive order beam) diffracted from the quadrant 803, and a fourth diffraction beam (e.g., −1st diffractive order beam) diffracted from the quadrant 805. Therefore, the locations of the interference patterns 913 and 915 are diagonally located from the interference patterns 909 and 911.

In an embodiment, intensity associated with the interference patterns (e.g., 909 and 911) may be expressed as $$I^+ = \left|A_1 e^{j\phi_1} + A_2 e^{j(\phi_2+\phi_{ov})}\right|^2 = A_1^2 + A_2^2 + 2A_1A_2\cos(\phi_2 - \phi_1 + \phi_{ov}) \quad \text{(Eq. 1)}$$

In an embodiment, intensity of the other interference patterns (e.g., 913 and 915) may be expressed as $$I^- = \left|A_1 e^{j\phi_1} + A_2 e^{j(\phi_2-\phi_{ov})}\right|^2 = A_1^2 + A_2^2 + 2A_1A_2\cos(\phi_2 - \phi_1 - \phi_{ov}) \quad \text{(Eq. 2)}$$

In the above equation 1 and 2, $\varnothing_1$ is the phase of the diffracted light 903 from the first overlay pattern in the quadrant 803, $\varnothing_2$ is the phase of the diffracted light 905 from the second overlay pattern in the quadrant 805, $\varnothing_{ov}$ is the phase difference caused by an overlay error between the first overlay pattern in the quadrant 803 and the second overlay pattern in the quadrant 805, $A_1e^{j\varnothing 1}$ is the intensity of +1 or −1 order diffraction beam diffracted from the first overlay pattern in the quadrant 803 by illuminating a radiation 801 (e.g., a coherent beam) on the first overlay pattern in the quadrant 803 on a top layer (e.g., a resist layer), $A_2e^{j(\varnothing_2+\varnothing_{ov})}$ is the intensity of the +1 order diffraction beam diffracted from the second overlay pattern in the quadrant 805 by illuminating the radiation 801 on the second overlay pattern in the quadrant 803 on a bottom layer (e.g., a product layer), and $A_2e^{j(\varnothing_2-\varnothing_{ov})}$ is the intensity of −1 order diffraction beam diffracted from the second overlay pattern in the quadrant 805 by illuminating the radiation 801 on the second overlay pattern in the quadrant 805 on a bottom layer (e.g., a product layer).

The difference of the intensity as discussed above due to the overlay error can be predicted by simulating the intensity using the equations above or from a database (e.g., stored on a processor of a computing system described herein) correlating properties of the interference pattern 909 and 911 with the overlay pattern and properties of the incoming radiation 801. Therefore, the overlay measurement can be determined from the interference patterns 909 and 911 even if one or more stacks (e.g., a deposition layer, a resist layer, an etch layer . . . etc) on the layer containing overlay pattern are on the first overlay pattern in the quadrant 803 and the second overlay pattern in the quadrant 805.

Figure 10A:
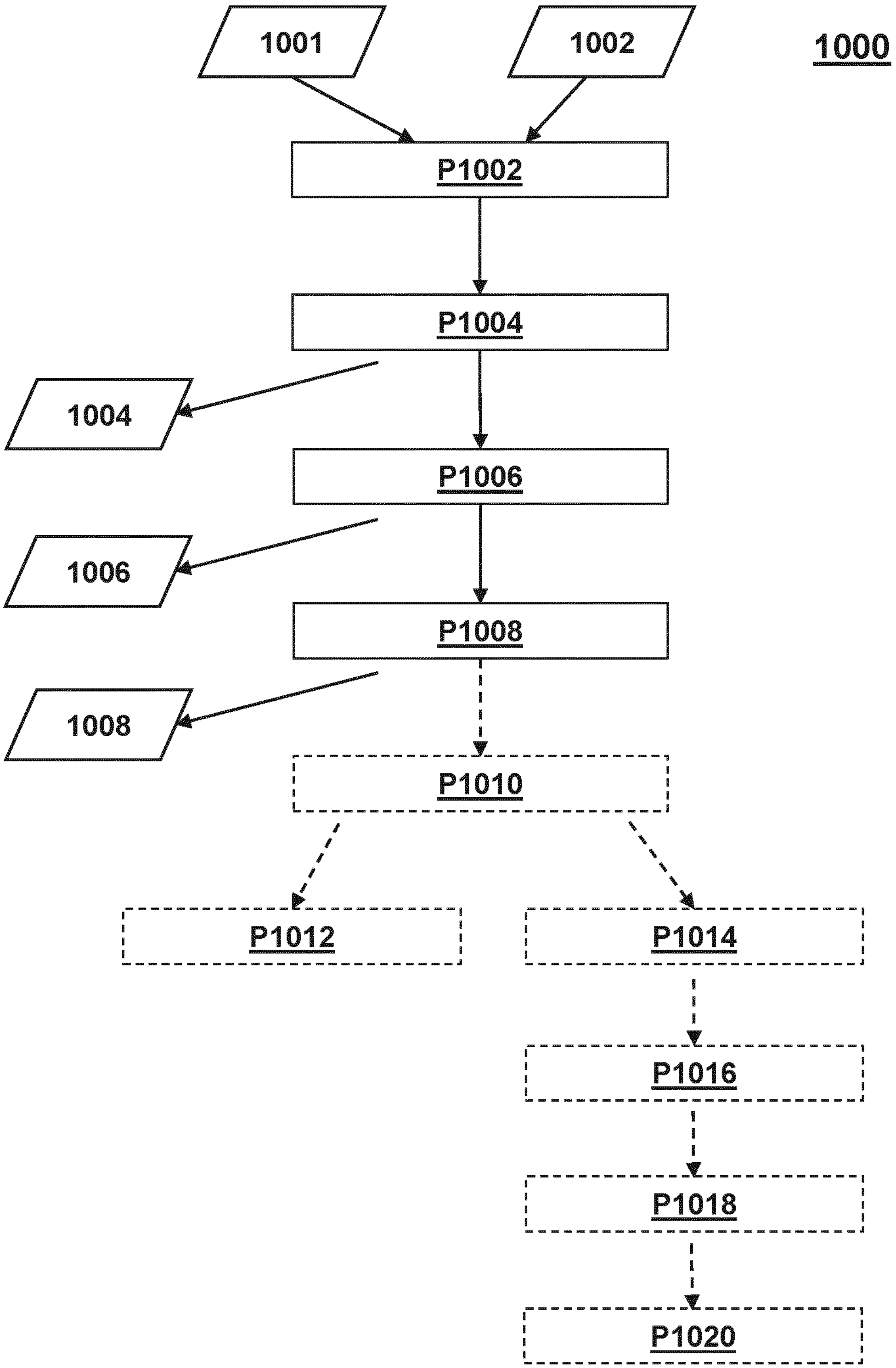
FIG. 10A illustrates an exemplary method of a process flow of determining an overlay measurement and a removal process of the substrate, according to an embodiment.

FIG. 10A is a flow chart of a method 1000 for determining an overlay measurement and optionally including a removal process of a layer of the substrate based on the overlay measurements, according to an embodiment.

In some embodiments, a method 1000 includes, at step P1002, illuminating a first overlay pattern 1001 (e.g., pattern in 803 in FIG. 8) and a second overlay pattern 1002 (e.g., pattern in 805 in FIG. 8) using a radiation beam (e.g., 110). In an embodiment, the radiation beam is a coherent beam generated by a beam generator (e.g., coherent beam generator) such as a coherent laser source. The first overlay pattern 1001 and the second overlay pattern 1002 may be obtained as discussed with respect to FIG. 8. For example, the first overlay pattern 1001 may be patterned by the first reference pattern and located in the quadrant 803, and the second overlay pattern 1002 may be patterned by the same reference pattern (e.g., first reference pattern) and located in the quadrant 805. Furthermore, the first overlay pattern 1001 may be disposed on a first layer of a substrate (e.g., a top layer, a resist layer, etc.), and the second overlay pattern 1002 disposed on a second layer of the substrate (e.g., a bottom layer, a product layer, etc.). In some embodiments, the overlay patterns patterned by the reference patterns need not be identical.

The method 1000 includes, at step P1004, generating a diffraction signal 1004 by illuminating the first overlay pattern 1001 and the second overlay pattern 1002 using the radiation e.g., 110 (e.g., coherent beam) generated by a beam generator (e.g., coherent beam generator). For example, the diffraction signal 1004 may be a superimposed signal constituted by a first diffracted light 903 from illuminating first overlay pattern 809 and a second diffracted light 905 from illuminating second overlay pattern 807 using the radiation 110 (e.g., coherent beam) generated by a beam generator (e.g., coherent beam generator). The diffraction signal 1004 may be detected by the light sensitive element 908 (e.g., a detector).

The method 1000 includes, at step P1006, obtaining an interference pattern 1006 based on the diffraction signal. The diffraction signal 1004 is generated as discussed in step P1004. The interference pattern 1006 may be obtained as discussed with respect to FIGS. 9A-9D.

The method 1000 includes, at step P1008, determining an overlay measurement 1008 between the first overlay pattern and the second overlay pattern based on the interference pattern 1006. The interference pattern may be obtained as discussed in FIGS. 9A-9D, and the interference pattern is obtained in step P1006. An overlay measurement 1008 is determined based on the interference pattern 1006. For example, the interference patterns 909 and 911 in FIG. 9C may change in shape based on the distance of the first overlay pattern and the second overlay pattern (e.g., a distance between the first overlay pattern on a top layer and the second overlay pattern on a bottom layer.). In an embodiment, the interference patterns 909 and 911 in FIG. 9C may change in shape based on the pitch and linewidth of the gratings between the first overlay pattern 809 and the second overlay pattern 807. In an embodiment, the overlay measurement 1008 is determined based on the information obtained from the shape of the interference pattern (e.g., 909 and 911). In an embodiment, the overlay measurement 1008 is determined based on the pitch of the first overlay pattern 1001 and the second overlay pattern 1002, and the linewidth of the first overlay pattern 1001 and the second overlay pattern 1002, the overlay measurement 1008 is determined.

The method 1000 includes, at step P1010, determining, via a processor, whether the overlay measurement 1008 breaches an overlay threshold value. The threshold value may be associated with a yield of the patterning process. For example, assume an overlay threshold value is 5 nm indicating a structure on the top layer is shifted by 5 nm with respect to the structure on the bottom layer. Such 5 nm shift causes the structure or an adjacent structure to not form within a specified dimension. Structures that do not meet the specified dimensions are considered failed or defective structures. Hence, the yield of the patterning process is reduced compared to a desired yield (e.g., 99.9%). A processor, or a computer system, may store the information obtained previous steps, e.g., overlay measurement in step P1008. The information may be associated with the distance of the first overlay pattern on a top layer and the second overlay pattern on a bottom layer. The information may also be associated with the pitch of the first overlay pattern and the second overlay pattern, and the linewidth of the first overlay pattern and the second overlay pattern. An overlay threshold value may be a value defined by a user of the system. In some embodiments, the overlay threshold value may be a standard deviation of the displacement between the first overlay pattern on a top layer (e.g., a resist layer) and the second overlay pattern on a bottom layer (e.g., a product layer).

The method 1000 may further include, at step P1012, continuing a next step of a fabrication process if the overlay measurement is not breaching (e.g., is smaller than) the threshold value. The next step of the fabrication process may be a deposition process in FIGS. 10B and 10C. The deposition process 1026 is performed if a top layer (e.g., a resist layer) having the overlay measurement value within the threshold value (e.g., a standard deviation of the displacement of the first overlay pattern on a top layer or the second overlay pattern on a bottom layer.). In some embodiments, the next step of the fabrication process at the P1012 may be an etching process, a diffusion process, or a combination thereof.

The method 1000 may further include, at step P1014, responsive to the breaching of the threshold value, providing, via an interface of a computer system, a signal or a notification to adjust the patterning process. In particular, the breaching of the threshold value occurs when the overlay measurement is larger or outside the range of the predetermined acceptable threshold value (e.g., a standard deviation of the displacement of the first overlay pattern on a top layer or the second overlay pattern on a bottom layer.). The signal or the notification, in one embodiment, may be a warning to adjust the patterning process may be a message shown on a display of the system, or an alarm or a warning light on the system to warn the user of the system.

The method 1000 may further include, at step P1016, adjusting one or more parameters to the mask MA and the substrate W of the lithographic apparatus with respect to FIG. 1 used in the patterning process such that the overlay measurement is minimized. The adjustment of the one or more parameters may be performed by one or more existing models in a database (e.g., a memory of a computer system of the lithographic apparatus, for example). The one or more existing models may be created by previous experiments of the patterning process or a simulation of the patterning process (e.g., Finite-difference time-domain method, etc.) The one or more parameters of the lithographic apparatus may be a dose of an incident beam of the lithographic apparatus to the mask MA with respect to FIG. 1, a focus associated with the lithographic apparatus to the mask MA with respect to FIG. 1, and a position of the substrate W being imaged by the lithographic apparatus. The overlay measurement may be minimized to be within or under the range of the threshold value (e.g., a standard deviation of the displacement of the first overlay pattern on a top layer or the second overlay pattern on a bottom layer.).

Figure 10B:
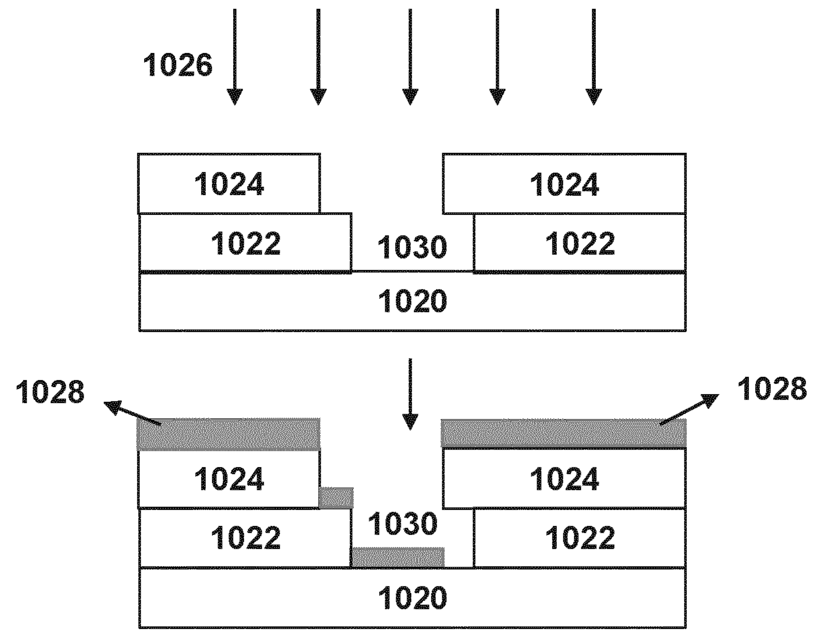
FIG. 10B illustrate a process flow of a deposition process using a resist layer having an overlay value breaching a threshold value, according to an embodiment.
Figure 10C:
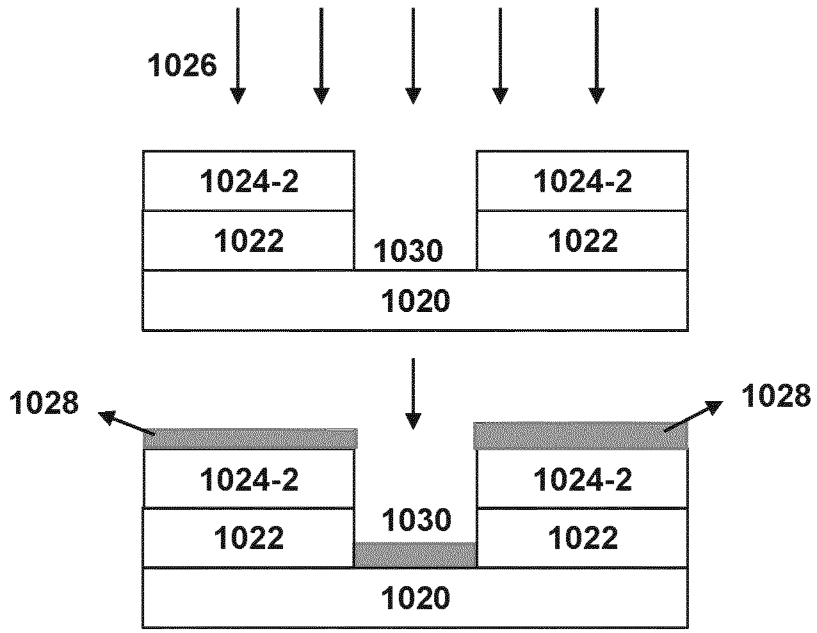
FIG. 10C illustrate a process flow of a deposition process using a resist layer having an overlay value within the threshold value, according to an embodiment.

The method 1000 may further include, at step P1018, performing a removal process of the second layer 1024 (e.g., the top layer, the resist layer) since the overlay measurement value associated with the second layer 1024 (e.g., the resist layer) is larger or outside the range of the predetermined acceptable threshold value as previously mentioned in the step P1014. For example, if the overlay measurement value associated with the second layer 1024 (e.g., the resist layer) is larger or outside the range of the predetermined acceptable threshold value, the subsequent fabrication processes such as deposition process 1026 may have an incomplete fill in a trench 1030 in the layer 1022 due to the misalignment between the layer 1024 and the layer 1022. Such incomplete fill (grey layer) of the trench 1030 may further create a defect (e.g., closed hole) in an integrated circuit device if the layer (e.g., a metal layer) in the trench 1030 is part of the circuit. Hence, the layer 1024 may be removed and a new layer may be deposited to improve the overlay. For example, in FIGS. 10B and 10C, a new layer 1024-2 (e.g., a second resist layer) may be patterned. In an embodiment, the new layer may be patterned using an adjusted dose and/or focus determined based on the overlay measurements. The new layer 1024-2 has an improved overlay performance with respect to the bottom layer 1022 (e.g., a product layer) compared to the overlay associated with the layer 1024 (in FIG. 10A) discussed earlier. Referring to FIG. 10B, when the deposition process 1026 is performed on the layers 1020, 1022, and 1024, the process creates a layer of e.g., a metal 1028 (e.g., aluminum, gold, etc.) on top of the surface of layers the 1020, 1022, and 1024. However, due to the misalignment between layers 1022 and 1024, a part of the trench 1030 in the layer 1022 under the shadow of the layer 1024 (on the right side of the trench 1030) is not filled with the metal 1028. Thereby forming a non-conductive region in the trench 1030. Such non-conductive region becomes a defect in the integrated circuit if the metal layer in the trench 1030 is part of the circuit. Therefore, the yield of the fabrication process associated with the layer 1024 is reduced. On the other hand, referring to FIG. 10C, the new layer 1024-2 is aligned well with the layer 1022. After the deposition process 1026 of the metal 1028, the trench 1030 in the layer 1022 is completely filled with the metal 1028. Therefore, there is no defect in the trench if the metal layer in the trench 1030 is part of the circuit. In other words, the fabrication process with the new layer 1024-2 has a better yield than the yield of the fabrication process with the layer 1024 since there is no defect in the integrated circuit.

Therefore, by accurately controlling an overlay between the top layer 1024 (e.g., a resist layer) and the second layer 1022 (e.g., a product layer), a yield of fabrication process may be improved or maintained within a desired limit. In some embodiments, the removal process of the second layer may include using a chemical solution to remove the second layer 1024 (e.g., the top layer, the resist layer). The chemical solution is able to dissolve layers containing photoresist (e.g., the resist layer). The chemical solution may be acetone, isopropanol, sulfuric acid, or the combination thereof.

Figure 10D:
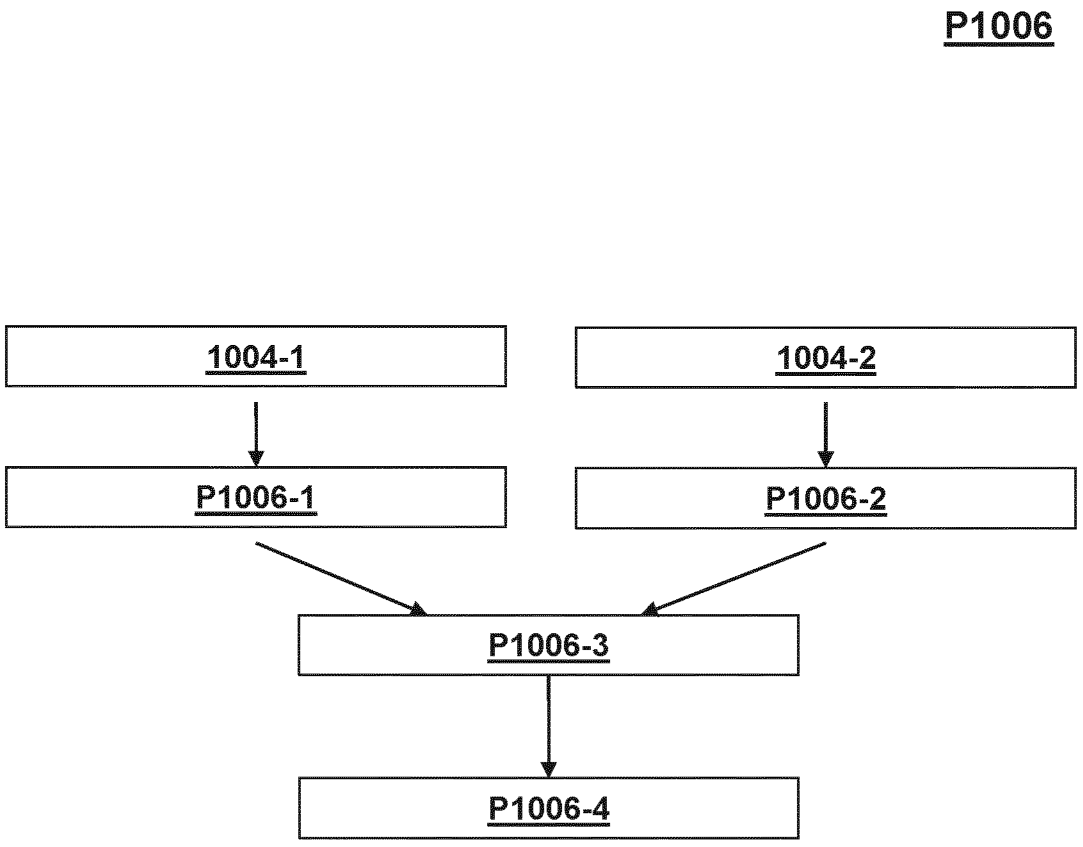
FIG. 10D illustrates an exemplary method of obtaining the interference pattern based on the diffraction signal, according to an embodiment.

The method 1000 may further include, at step P1020, patterning, after the removal process of the second layer 1024, a new layer 1024-2 (e.g., a second resist layer) on the first layer 1022 (e.g., product layer) on the substrate 1020 by using the adjusted one or more parameters of the lithographic apparatus. The new layer 1024-2 (e.g., a second resist layer) on the first layer 1022 may use an adjusted dose of an incident beam of the lithographic apparatus, an adjusted focus associated with the lithographic apparatus, and an adjusted position of the substrate being imaged by the lithographic apparatus to pattern the new layer 1024-2 (e.g., a second resist layer) as previously mentioned in the step P1016. FIG. 10D illustrates an exemplary process of obtaining the interference pattern based on the diffraction signal, according to an embodiment. The diffraction signal is generated as discussed in step P1004. The interference pattern may be obtained as discussed in FIGS. 9A-9D.

Step P1006-1 is the obtaining of a first diffraction signal 1004-1 diffracted from the first overlay pattern in the quadrant 803. The obtaining of the first diffraction signal 1004-1 may be performed similarly as previously discussed in step P1004 by illuminating the first overlay pattern in the quadrant 803 using the radiation 801 (e.g., coherent beam.) generated by a beam generator (e.g., coherent beam generator).

Step P1006-2 is the obtaining of a second diffraction signal 1004-2 diffracted from the second overlay pattern in the quadrant 805. The obtaining of the second diffraction signal 1004-2 may be performed similarly as previously discussed in step P1004 by illuminating the second overlay pattern in the quadrant 805 using the radiation 801 (e.g., coherent beam) generated by a beam generator (e.g., coherent beam generator).

Step P1006-3 is a step of superposing the first diffraction signal 903 and the second diffraction signal 905 at the pupil plane 907. The first diffraction signal 903 and the second diffraction signal 905 are superposed at the pupil plane 907 as previously described in FIGS. 9A and 9B.

Step P1006-4 is a step of generating, based on the superimposed diffraction signals, the interference pattern at the pupil plane 907. The interference patterns (e.g., 909, 911, 913, 915) are described and shown earlier in FIGS. 9C and 9D.

Figure 10E:
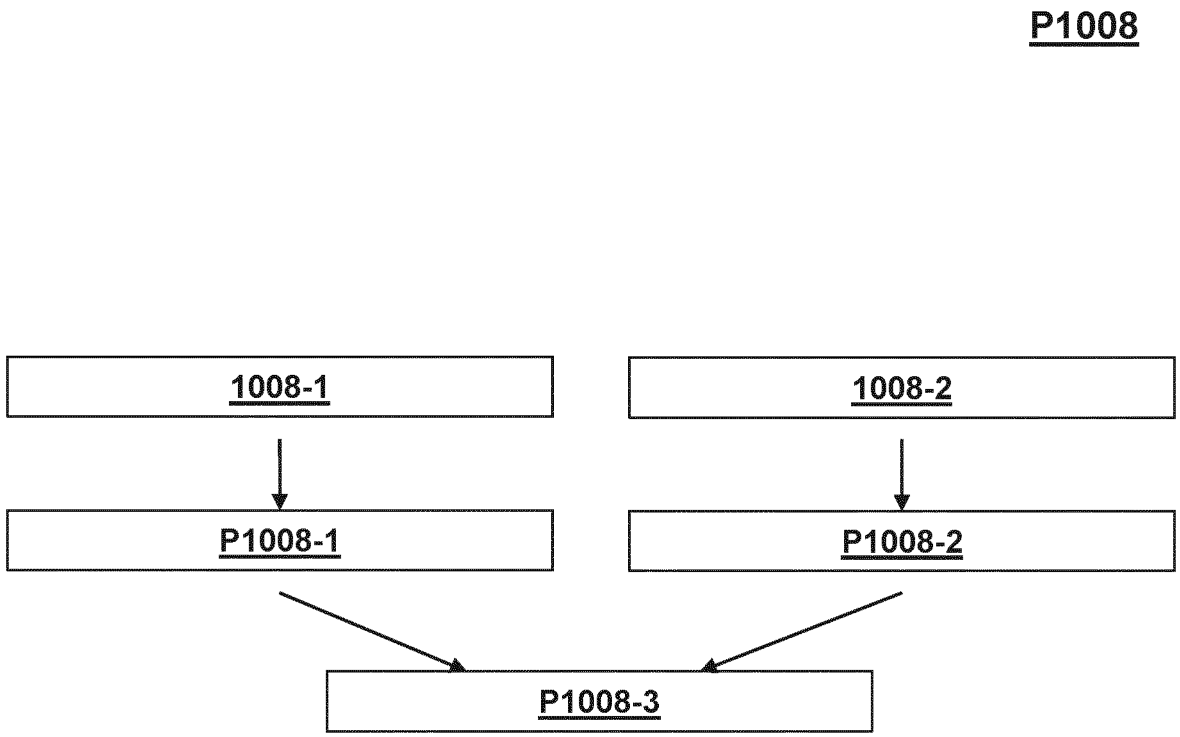
FIG. 10E illustrates an exemplary method of determining the overlay measurement between the first overlay pattern and the second overlay pattern, according to an embodiment.

FIG. 10E illustrates an exemplary process of determining the overlay measurement between the first overlay pattern in the quadrant 803 and the second overlay pattern in the quadrant 805, according to an embodiment.

Step P1008-1 is the obtaining of a first location associated with a first interference fringe 1008-1 of the interference pattern. For example, the first location may be a X-axis value and a Y-axis value of the interference pattern 909 in FIGS. 9C and 9D. In some embodiments, the first interference fringe 1008-1 may be associated with a positive non-zeroth order diffraction of the diffraction signal. (e.g., +1 order diffraction, +2 diffraction order . . . , etc.)

Step P1008-2 is the obtaining of a second location associated with a second interference fringe 1008-2 of the interference pattern. For example, the second location may be X-axis value and Y-axis value of the interference pattern 911 in FIG. 9D. In some embodiments, the second interference fringe 1008-2 is associated with a negative non-zeroth order diffraction of the diffraction signal. (e.g., −1 order diffraction, −2 diffraction order . . . , etc.)

Step P1008-3 is a step of determining, based on the first location and the second location associated with the interference pattern, an overlay error between the first overlay pattern and the second overlay pattern. As previously discussed in the step P1008 in FIG. 10A, the overlay error between the first overlay pattern and the second overlay pattern can be determined based on interference pattern. For example, the interference patterns 909 and 911 in FIG. 9C may change in shape based on the distance between the first overlay pattern and the second overlay pattern (e.g., a distance between the first overlay pattern on a top layer and the second overlay pattern on a bottom layer). In some embodiments, the interference patterns 909 and 911 in FIG. 9C may change the shape based on the pitch and linewidth of the gratings in the first overlay pattern and the second overlay pattern. In an embodiment, the overlay measurement 1008 is determined based on the information obtained from the shape of the interference pattern (e.g., 909 and 911). In an embodiment, the overlay measurement 1008 is determined based on the pitch of the first overlay pattern 1001 and the second overlay pattern 1002, and the linewidth of the first overlay pattern 1001 and the second overlay pattern 1002. In some embodiments, the overlay error can be determined from the first location associated with the interference pattern 909 and the second location associated with the interference pattern 911. The locations of the interference patterns 909 and 911 may be dependent on the superimposed diffraction signals as previously mentioned in the step P1006-4 because the superimposed diffraction signals depend on the interaction of the first diffraction signal 1004-1 in the step P1006-1 and the second diffraction signal 1004-2 in the step P1006-2. For example, if the first diffraction signal 1004-1 and the second diffraction signal 1004-2 have a constructive interference at first location associated with the interference pattern 909 on the pupil plane, then the interference pattern 909 shows a dark spot which represents a relatively strong signal. In contrast, if the first diffraction signal 1004-1 and the second diffraction signal 1004-2 have a destructive interference at first location associated with the interference pattern 909 on the pupil plane, then the interference pattern 909 shows a bright spot which represents a relatively weak signal. With the changes of the interference of the superimposed diffraction signals at the first location associated with the interference pattern 909 and second location associated with the interference pattern 911, the center locations of the interference patterns 909 and 911 move with the interference of the first diffraction signal 1004-1 and the second diffraction signal 1004-2.

Therefore, the locations of the interference patterns 909 and 911 are dependent on first diffraction signal 1004-1 and the second diffraction signal 1004-2. In addition, the first diffraction signal 1004-1 and the second diffraction signal 1004-2 are dependent on the phase of the first diffraction signal diffracted from the first overlay pattern in the quadrant 803 on the top layer (e.g., the resist layer), and the phase of the second overlay pattern in the quadrant 805 on the bottom layer (e.g., the product layer). However, because the distance between the top layer and the bottom layer is fixed, if there is an overlay error between the top layer and the bottom layer (e.g., misalignment between a trench pattern on the resist layer and the trench pattern on the product layer), the center location of the first interference pattern 909 and the second interference pattern 911 will move accordingly. By calculating the relative location between the center locations of the first interference pattern 909 and the second interference pattern 911, the overlay error can be calculated (e.g., finite-difference time-domain method) via the processor (e.g., a computer, a data storage, a data base system, etc).

Figure 11:
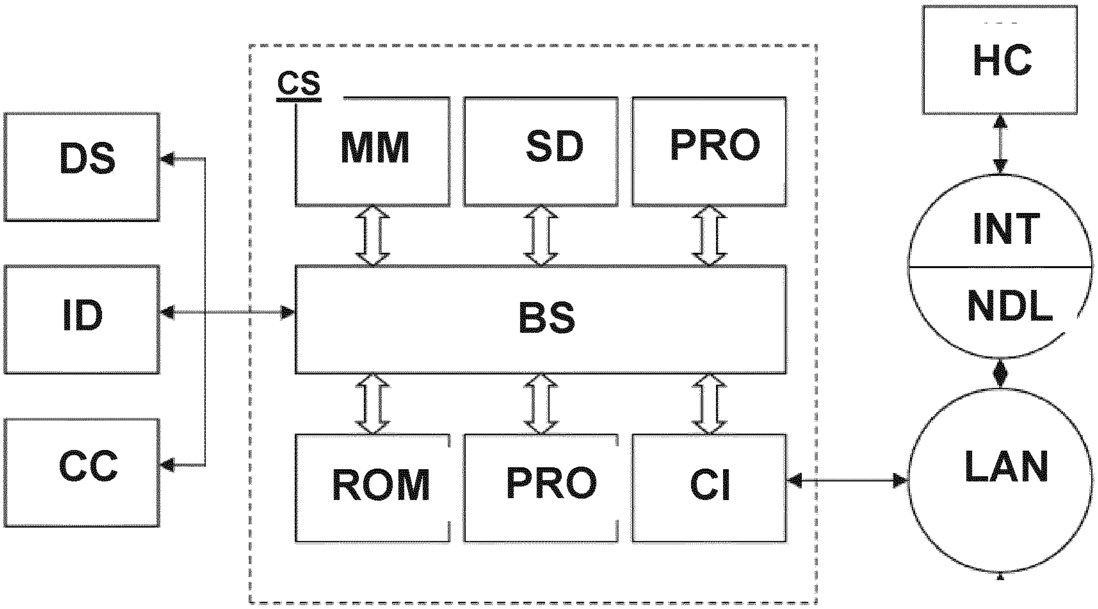
FIG. 11 is a block diagram of an example computer system for use in performing some of the methods described herein, according to an embodiment.

FIG. 11 is a block diagram of an example computer system CS, according to an embodiment. The computer system CS may be used for controlling the lithographic apparatus in FIG. 1, determining whether the overlay measurement breaches on an overlay threshold value in the step P1010, or calculating the overlay error as discussed in the step P1008-3. Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated service digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 12:
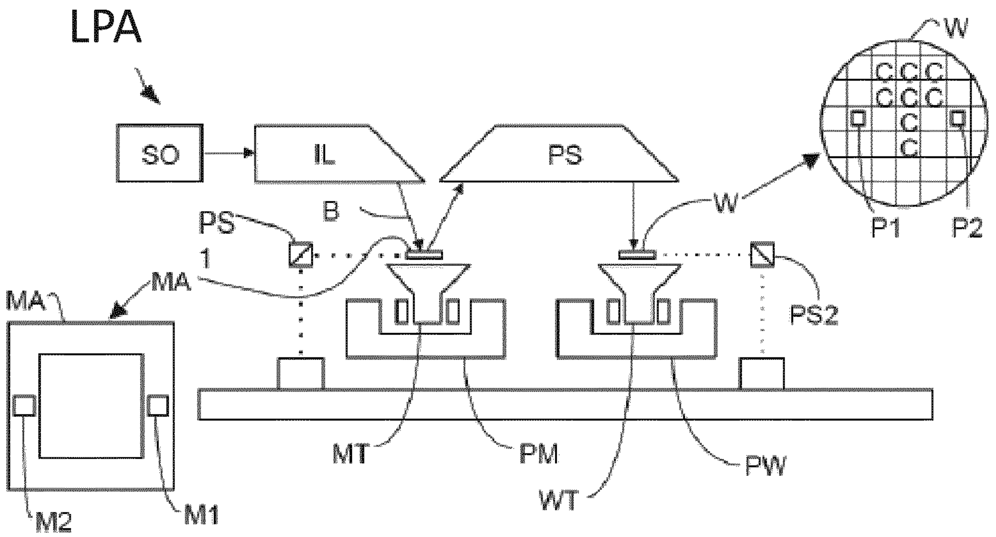
FIG. 12 is a schematic diagram of another lithographic projection apparatus (LPA), according to an embodiment.

FIG. 12 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser, not shown in FIG. 11, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (e.g. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (e.g. a single dynamic exposure). The velocity and direction of substrate table WT relative to the support structure (e.g. patterning device table) MT may be determined by the (de-)magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
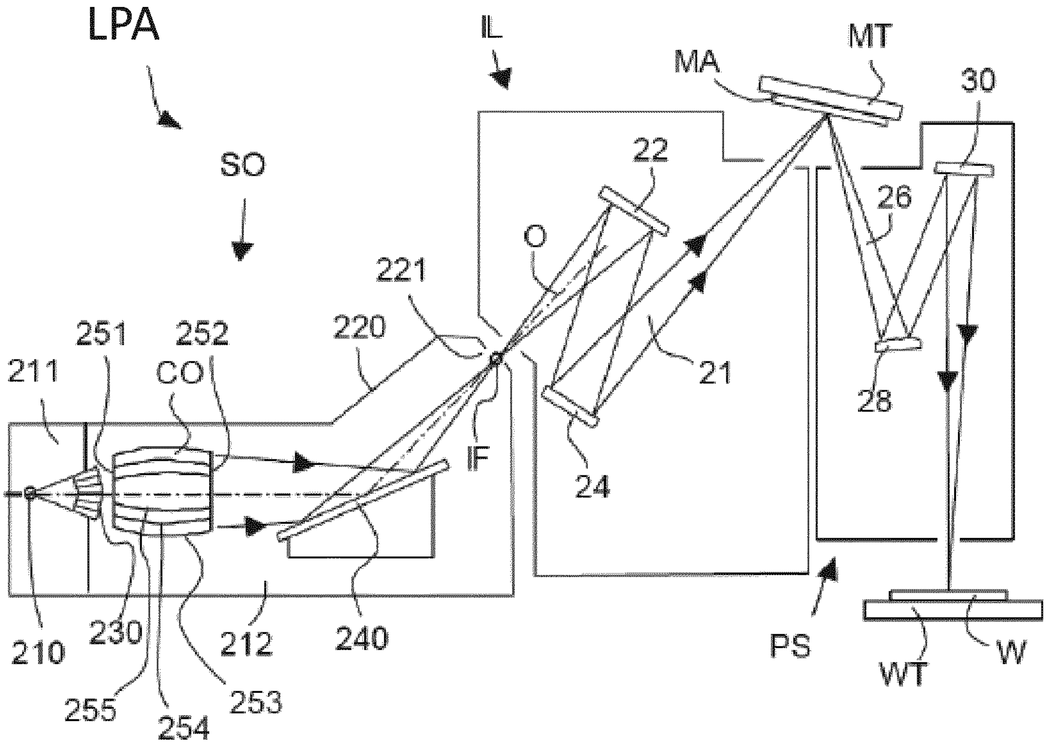
FIG. 13 is a detailed view of the lithographic projection apparatus, according to an embodiment.

FIG. 13 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 14:
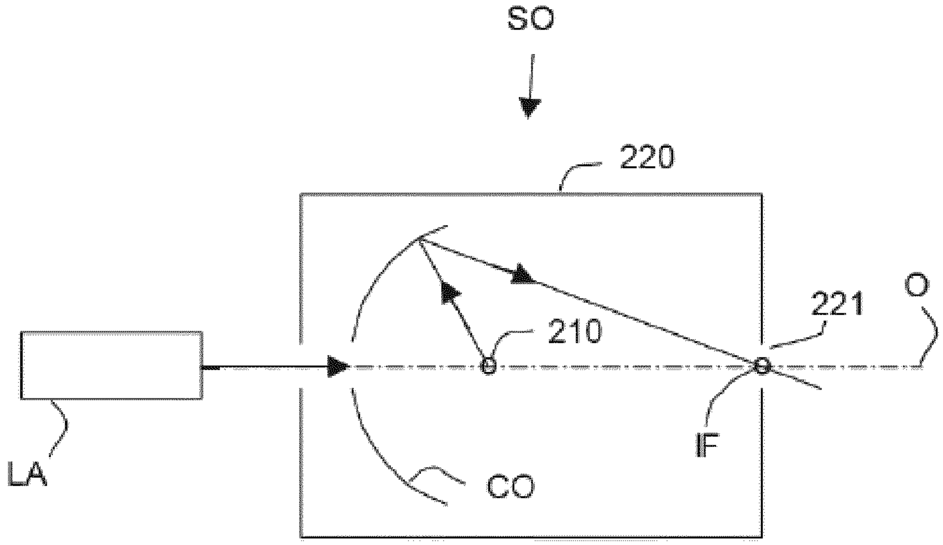
FIG. 14 is a detailed view of source collector module SO of lithographic projection apparatus LPA, according to an embodiment.

FIG. 14 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of determining an overlay measurement associated with a substrate, the method comprising:
   - generating a diffraction signal by illuminating a first overlay pattern and a second overlay pattern using a coherent beam, the first overlay pattern disposed on a first layer of a substrate, and the second overlay pattern disposed on a second layer of the substrate;
   - obtaining, based on the diffraction signal, an interference pattern; and
   - determining, based on the interference pattern, an overlay measurement between the first overlay pattern and the second overlay pattern.

2. The method according to clause 1, wherein the first overlay pattern and the second overlay pattern are patterned using a reference pattern.

3. The method according to clause 2, wherein the first overlay pattern is imaged at a first location on the substrate and the second overlay pattern is imaged at a second location of the substrate, the second location being diagonally opposite to the first location.

4. The method according to clause 1, wherein the interference pattern is obtained at a pupil plane.

5. The method according to any of clauses 1-4, wherein the interference pattern is dependent on a physical characteristic of the first overlay pattern and the second overlay pattern.

6. The method according to clause 5, wherein the physical characteristic is a distance between the first overlay pattern and the second overlay pattern, a pitch of the first overlay pattern and the second overlay pattern, a linewidth of the first overlay pattern and the second overlay pattern, or a combination thereof.

7. The method according to any of clauses 1-6, wherein the interference pattern is dependent on a wavelength of the coherent beam and a distance between the first overlay pattern and the second overlay pattern.

8. The method according to clause 7, wherein the coherent beam is from a tunable light source, the tunable light source configured to adjust the wavelength of the coherent beam.

9. The method according to clause 8, wherein the tunable light source further configured to:
perform a wavelength sweeping of the coherent beam;
obtain modulated interference fringes associated with the sweeping of the wavelength; and
determine the overlay measurement based on the modulated interference fringes.

10. The method according to clause 4, wherein the pupil plane is located at a specified distance with respect to the substrate, the specified distance being larger than a single wavelength of an incident beam.

11. The method according to any of clauses 1-10, wherein the coherent beam is a coherent Gaussian beam.

12. The method according to any of clauses 1-11, wherein the coherent beam is incident perpendicular to the substrate.

13. The method according to any of clauses 1-12, wherein obtaining the interference pattern comprises:
obtaining a first diffraction signal diffracted from the first overlay pattern;
obtaining a second diffraction signal diffracted from the second overlay pattern;
superposing the first diffraction signal and the second diffraction signal at the pupil plane; and
generating, based on the superimposed diffraction signals, the interference pattern at the pupil plane.

14. The method according to any of clauses 1-13, wherein determining the overlay measurement between the first overlay pattern and the second overlay pattern comprises:
obtaining a first location associated with a first interference fringe of the interference pattern, the first interference fringe being associated with a positive non-zeroth order diffraction of the diffraction signal;
obtaining a second location associated with a second interference fringe of the interference pattern, the second interference fringe being associated with a negative non-zeroth order diffraction of the diffraction signal; and
determining, based on the first location and the second location associated with the interference pattern, an overlay error between the first overlay pattern and the second overlay pattern.

15. The method according to clause 14, wherein the interference pattern at the pupil plane includes higher diffraction orders, the higher diffraction orders being greater than 2nd order.

16. The method according to any of clauses 1-15, further comprising:
determining, via a processor, whether the overlay measurement breaches an overlay threshold value, the threshold value being associated with a yield of the patterning process; and
responsive to the breaching of the threshold value, providing, via an interface, a warning to adjust the patterning process.

17. The method according to clause 16, further comprising:
determining, via the processor, whether the overlay measurement breaches the overlay threshold value;
responsive to the breaching of the threshold value, adjusting one or more parameters of a patterning apparatus used in the patterning process such that the overlay measurement is minimized;
performing a removal process of the second layer; and
patterning, after the removal process of the second layer, a new layer on the first layer on the substrate by using the adjusted one or more parameters of the patterning apparatus.

18. The method according to clause 17, wherein the one or more parameters comprise:
a dose of an incident beam of the patterning apparatus;
a focus associated with the patterning apparatus; and
a position of the substrate being imaged via the patterning apparatus.

19. The method according to clause 17, wherein the removal process comprises using a chemical solution to remove the second layer, the chemical solution being able to dissolve layers containing photoresist.

20. A computer program product comprising a non-transitory computer readable medium having instructions recorded thereon, the instructions when executed by a computer implementing the method of any of the above clauses.

21. A system to obtain an overlay measurement associated with a patterning process, the system comprising:
a coherent beam generator configured to generate a coherent beam for illuminating a first overlay pattern and a second overlay pattern, the first overlay pattern disposed on a first layer of a substrate, the second overlay pattern disposed on a second layer of the substrate, the illuminating of the first overlay pattern and the second overlay pattern generating a diffraction signal;
a detector configured to detect the diffraction signal and generate an interference pattern from the diffraction signal; and
at least one processor configured to determine an overlay measurement between the first overlay pattern and the second overlay pattern based on the interference pattern.

22. The system according to clause 21, wherein the interference pattern is dependent on a physical characteristic of the first overlay pattern and the second overlay pattern.

23. The system according to clause 22, wherein physical characteristic is a distance between the first overlay pattern and the second overlay pattern, a pitch of the first overlay pattern and the second overlay pattern, a linewidth of the first overlay pattern and the second overlay pattern, or a combination thereof.

24. The system according to clause 21, wherein the diffraction signal is detected at a pupil plane.

25. The system according to any of clauses 21-24, wherein the interference pattern is dependent on a wavelength of the coherent beam and a distance between the first overlay pattern and the second overlay pattern.

26. The system according to any of clauses 21-25, wherein the coherent beam is from a tunable light source, the tunable light source configured to adjust the wavelength of the coherent beam.

27. The system according to clause 26, wherein the at least one processor is further configured to:
perform a wavelength sweeping of the coherent beam generated by the tunable light source;
obtain modulated interference fringes associated with the sweeping of the wavelength; and
determine the overlay measurement based on the modulated interference fringes.

28. The system according to clause 21, wherein the coherent beam is a coherent Gaussian beam.

29. The system according to clause 21, wherein the coherent beam is incident, via an objective lens, perpendicular to the substrate.

30. The system according to clause 21, wherein the detector is a camera comprising a sensor configured to capture an image of the pupil plane associated with an objective lens used to illuminate the substrate.

31. The system according to clause 21, wherein the processor is further configured to:

determine whether the overlay measurement breaches an overly threshold value, the threshold value being associated with a yield of the patterning process; and responsive to the breaching of the threshold value, provide, via an interface, a warning to adjust the patterning process.

32. The system according to clause 21, wherein the first overlay pattern and the second overlay pattern are patterned using a reference pattern.

33. The system according to clause 21, wherein the first overlay pattern is imaged at a first location on the substrate and the second overlay pattern is imaged at a second location of the substrate, the second location being diagonally opposite to the first location.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While specific embodiments of the disclosure have been described above, it will be appreciated that the disclosure may be practiced otherwise than as described. While the example structures described above as metrology marks are grating structures specifically designed and formed for the purposes of position measurement, in other embodiments, positions may be measured on structures which are functional parts of devices formed on the substrate.

Many devices have regular, grating-like structures. The terms "mark" and "grating structure" as used herein do not require that the structure be provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position-measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure.

This computer program may be executed, for example, by a processor or the like which is dedicated to that purpose. There may also be provided a data storage medium (e.g., semiconductor memory, magnetic or optical disk) having such a computer program stored therein.

Although specific reference may have been made above to the use of embodiments of the disclosure in the context of optical lithography, it will be appreciated that the disclosure may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens," where the context allows, may refer to any one or a combination of various types of optical components, including refractive, reflective, magnetic, electromagnetic and electrostatic optical components. Reflective components are likely to be used in an apparatus operating in the UV and/or EUV ranges.

The breadth and scope of the present disclosure should not be limited by any of the above described exemplary embodiments, but should be defined only in accordance with the following claims and their equivalents.

While the concepts disclosed herein may be used on a substrate such as a silicon wafer, it shall be understood that the disclosed concepts may be used with any type of lithographic systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method of determining an overlay measurement associated with a substrate, the method comprising:

generating a diffraction signal by illuminating at least part of a first overlay pattern and at least part of a second overlay pattern using a coherent beam, the first overlay pattern disposed on a first layer of a substrate, the second overlay pattern disposed on a second layer of the substrate, and the at least part of the second overlay pattern not overlapping the at least part of the first overlay pattern;

obtaining, based on the diffraction signal, an interference pattern in a measurement plane arising from interference of radiation from the first overlay pattern with radiation from the second overlay pattern; and determining, based on the interference pattern, an overlay measurement between the first overlay pattern and the second overlay pattern, wherein determining the overlay measurement between the first overlay pattern and the second overlay pattern comprises:

obtaining a value of the position of a first location, in the measurement plane, associated with a first interference fringe of the interference pattern, the first interference fringe being associated with a positive non-zeroth order diffraction of the diffraction signal;

obtaining a value of the position of a second location, in the measurement plane, associated with a second interference fringe of the interference pattern, the second interference fringe being associated with a negative non-zeroth order diffraction of the diffraction signal; and determining, based on the values of the positions of the first and second locations, the overlay measurement between the first overlay pattern and the second overlay pattern.

2. The method according to claim 1, wherein the first overlay pattern and the second overlay pattern are patterned using a reference pattern.

3. The method according to claim 2, wherein the first overlay pattern is imaged at a first location on the substrate and the second overlay pattern is imaged at a second location of the substrate, the second location being diagonally opposite to the first location.

4. The method according to claim 1, wherein the interference pattern is obtained at a pupil plane.

5. The method according to claim 4, wherein the pupil plane is located at a specified distance with respect to the substrate, the specified distance being larger than a single wavelength of an incident beam.

6. The method according to claim 1, wherein the interference pattern is dependent on a physical characteristic of the first overlay pattern and the second overlay pattern.

7. The method according to claim 6, wherein the physical characteristic is a distance between the first overlay pattern and the second overlay pattern, a pitch of the first overlay pattern and the second overlay pattern, a linewidth of the first overlay pattern and the second overlay pattern, or a combination selected therefrom.

8. The method according to claim 1, wherein the interference pattern is dependent on a wavelength of the coherent beam and a distance between the first overlay pattern and the second overlay pattern.

9. The method according to claim 8, wherein the coherent beam is from a tunable light source, the tunable light source configured to adjust the wavelength of the coherent beam.

10. The method according to claim 9, wherein the tunable light source is further configured to:
- perform a wavelength sweeping of the coherent beam;
- obtain modulated interference fringes associated with the sweeping of the wavelength; and
- determine the overlay measurement based on the modulated interference fringes.

11. The method according to claim 1, wherein the coherent beam is a coherent Gaussian beam.

12. The method according to claim 1, wherein the coherent beam is incident perpendicular to the substrate.

13. The method according to claim 1, wherein obtaining the interference pattern comprises:
- obtaining a first diffraction signal diffracted from the first overlay pattern;
- obtaining a second diffraction signal diffracted from the second overlay pattern;
- superposing the first diffraction signal and the second diffraction signal at the pupil plane; and
- generating, based on the superimposed diffraction signals, the interference pattern at the pupil plane.

14. The method according to claim 1, wherein the interference pattern at a pupil plane includes higher diffraction orders, the higher diffraction orders being greater than 2nd order.

15. The method according to claim 1, further comprising:
- determining, via a processor, whether the overlay measurement breaches an overlay threshold value, the threshold value being associated with a yield of the patterning process; and
- responsive to the breaching of the threshold value, providing, via an interface, a warning to adjust the patterning process.

16. The method according to claim 1, further comprising:
- determining, via a processor, whether the overlay measurement breaches an overlay threshold value;
- responsive to the breaching of the threshold value, adjusting one or more parameters of a patterning apparatus used in the patterning process such that a value of the overlay measurement is reduced or minimized;
- performing a removal process of the second layer; and
- patterning, after the removal process of the second layer, a new layer on the first layer on the substrate by using the adjusted one or more parameters of the patterning apparatus.

17. The method according to claim 16, wherein the one or more parameters comprise:
- a dose of an incident beam of the patterning apparatus;
- a focus associated with the patterning apparatus; and/or
- a position of the substrate being imaged via the patterning apparatus.

18. A system to obtain an overlay measurement associated with a patterning process, the system comprising:
- a coherent beam generator configured to generate a coherent beam for illuminating at least of a first overlay pattern and at least part of a second overlay pattern, the first overlay pattern disposed on a first layer of a substrate, the second overlay pattern disposed on a second layer of the substrate, the at least part of the second overlay pattern not overlapping the at least part of the first overlay pattern, and the illumination of the first overlay pattern and the second overlay pattern generating a diffraction signal;
- a detector configured to detect the diffraction signal and generate an interference pattern, in a measurement plane, from the diffraction signal, the interference pattern arising from interference of radiation from the first overlay pattern with radiation from the second overlay pattern; and
- a processor system configured to determine an overlay measurement between the first overlay pattern and the second overlay pattern based on the interference pattern, the determination of the overlay measurement between the first overlay pattern and the second overlay pattern comprising:
- obtaining of a value of the position of a first location, in the measurement plane, associated with a first interference fringe of the interference pattern, the first interference fringe being associated with a positive non-zeroth order diffraction of the diffraction signal;
- obtaining of a value of the position of a second location, in the measurement plane, associated with a second interference fringe of the interference pattern, the second interference fringe being associated with a negative non-zeroth order diffraction of the diffraction signal; and
- determination, based on the values of the positions of the first and second locations, the overlay measurement between the first overlay pattern and the second overlay pattern.

19. The system according to claim 18, wherein the interference pattern is dependent on a physical characteristic of the first overlay pattern and the second overlay pattern.

20. The system according to claim 18, wherein the interference pattern at a pupil plane includes higher diffraction orders, the higher diffraction orders being greater than 2nd order.

* * * * *